United States Patent
Vatelmacher

(10) Patent No.: US 12,433,055 B2
(45) Date of Patent: Sep. 30, 2025

(54) SYSTEM AND METHODS FOR MANUFACTURING A CRISSCROSS MATRIX OF SUB DIVIDED SOLAR CELLS

(71) Applicant: SOLARWAT LTD., Even Yehuda (IL)

(72) Inventor: Boris Vatelmacher, Even Yehuda (IL)

(73) Assignee: SOLARWAT LTD., Even Yehuda (IL)

( * ) Notice: Subject to any disclaimer, the term of this patent is extended or adjusted under 35 U.S.C. 154(b) by 343 days.

(21) Appl. No.: 18/018,770

(22) PCT Filed: Aug. 3, 2021

(86) PCT No.: PCT/IL2021/050943
§ 371 (c)(1),
(2) Date: Jan. 30, 2023

(87) PCT Pub. No.: WO2022/029773
PCT Pub. Date: Feb. 10, 2022

(65) Prior Publication Data
US 2023/0307574 A1      Sep. 28, 2023

Related U.S. Application Data

(60) Provisional application No. 63/085,168, filed on Sep. 30, 2020, provisional application No. 63/060,151, filed on Aug. 3, 2020.

(51) Int. Cl.
H10F 71/00      (2025.01)

(52) U.S. Cl.
CPC .............................. H10F 71/1375 (2025.01)

(58) Field of Classification Search
CPC ........ H10F 19/00; H10F 19/70; H10F 19/906; H10F 77/937
See application file for complete search history.

(56) References Cited

U.S. PATENT DOCUMENTS

| | | |
|---|---|---|
| 2008/0223429 A1 | 9/2008 | Everett et al. |
| 2016/0163914 A1 | 6/2016 | Gonzalez et al. |
| 2020/0007078 A1 | 1/2020 | Vatelmacher et al. |

FOREIGN PATENT DOCUMENTS

| | | |
|---|---|---|
| KR | 20110019881 A | 3/2011 |
| WO | 2017021289 A1 | 2/2017 |

OTHER PUBLICATIONS

International Search Report and Written Opinion dated Dec. 6, 2021 in PCT International Patent Application No. PCT/IL2021/050943, 9 pages.

*Primary Examiner* — Matthew L Reames
(74) *Attorney, Agent, or Firm* — SNELL & WILMER L.L.P.

(57) ABSTRACT

A method for manufacturing a Solar Sub-cells Crisscross matrix Array (SSCA) of solar sub-cells (SSC), wherein each row includes n SSC, and each column includes m SSC, the method includes: placing n×m of SSC onto a narrow sub-cells receptor conveyer belt configured to carry a stream of the SSC; transferring m rows of SSC to a wide array conveyor belt, one row at a time, forming thereon an array of the SSC; placing n busbars or groups of Smart Wire (SW) conductors on each of the n columns of SSC; placing short parallel jumpers between all pairs of neighboring the SSC in each of the m rows; placing wide transverse conductors for parallel connection of the n column and for diodes connection; and soldering the n×m matrix array of SSC with the short parallel jumpers and the wide transverse conductors, to thereby form a soldered SSCA.

20 Claims, 17 Drawing Sheets

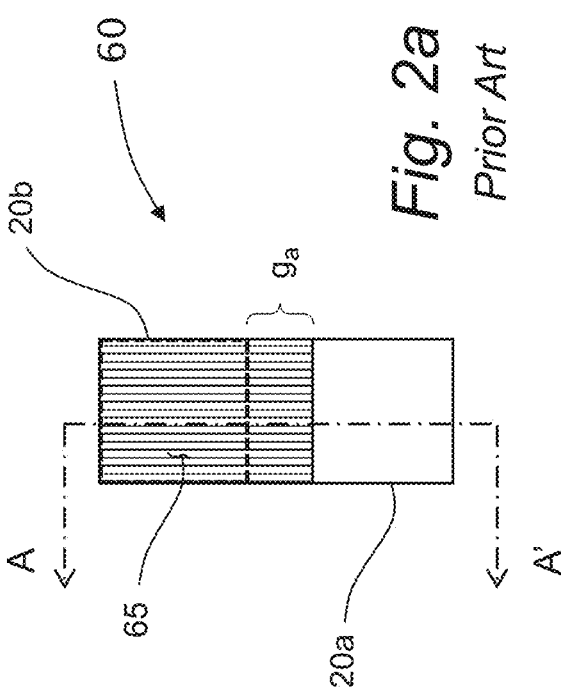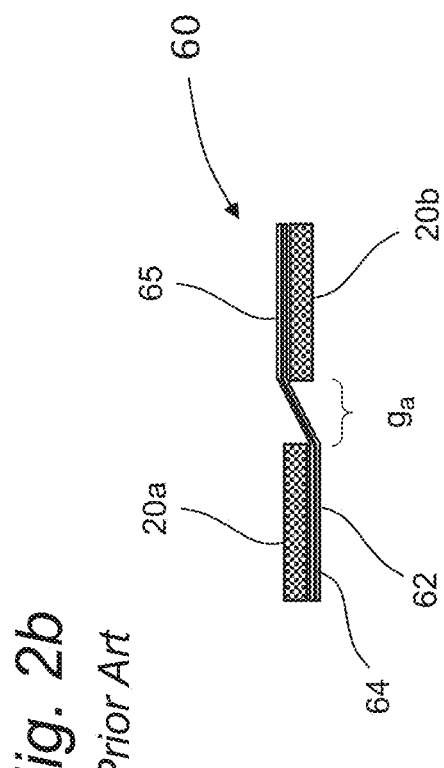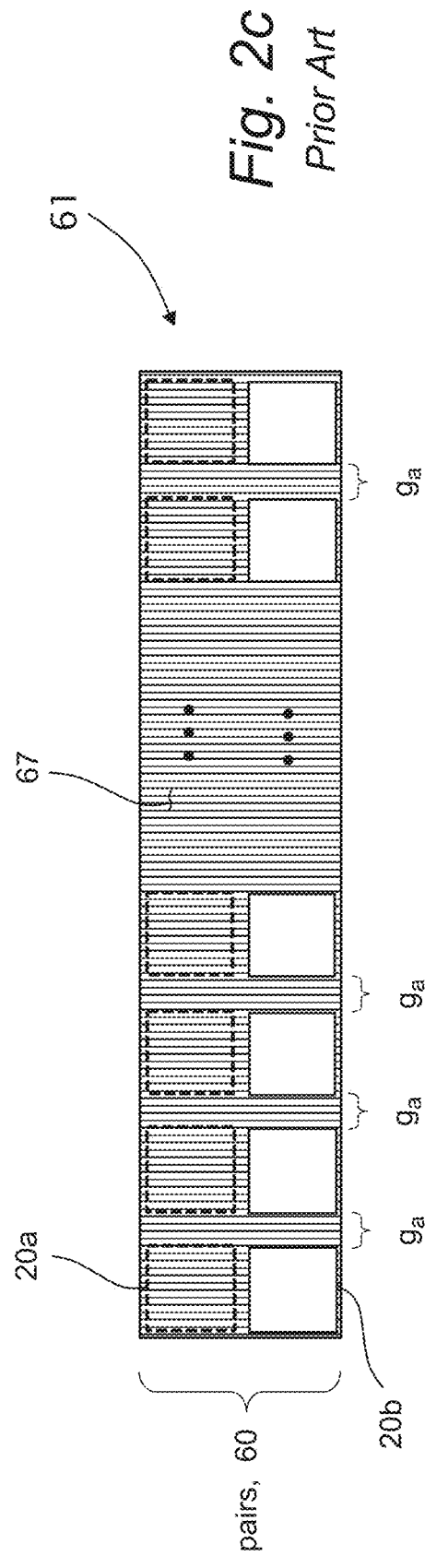

SYSTEM AND METHODS FOR MANUFACTURING A CRISSCROSS MATRIX OF SUB DIVIDED SOLAR CELLS

CROSS REFERENCE TO RELATED APPLICATIONS

This application is a U.S. National Stage Entry under 35 U.S.C. § 371 of International Application No. PCT/IL2021/050943 filed Aug. 3, 2021 entitled "SYSTEM AND METHODS FOR MANUFACTURING A CRISSCROSS MATRIX OF SUB DIVIDED SOLAR CELLS," which is pending and claims priority to and the benefit of U.S. Provisional Patent Application Ser. No. 63/085,168 filed on Sep. 30, 2020, and U.S. Provisional Patent Application Ser. No. 63/060,151 filed on Aug. 3, 2020. The contents of each application are incorporated herein by reference in their entireties.

FIELD OF THE INVENTION

The present invention relates to systems and methods for manufacturing solar array modules for generating electric-power and more particularly, to systems and methods having PV solar sub cells interconnected in a crisscross matrix array configuration.

BACKGROUND OF THE INVENTION

The manufacturing system and method of the present disclosure relates to manufacturing lines of production and manufacturing processes of solar panels having an array of solar sub-cells that are electrically interconnected both in serial and in parallel. The term "solar sub-cell" relates to a solar cell that is cut from a regular sized solar cell, where the dimensions of a regular sized solar cell are typically, nowadays, 156 mm×156 mm, but may be enlarged or minimized (herein referred to as "regular solar cell"). Hence, if, for example, the regular solar cell is cut into 4 stripes of similar sub-cells, the dimension of each sub-cell is about 39 mm×156 mm. This none limiting example of a solar sub-cell yields k elongated stripes of similar sub-cells, by cutting a regular solar cell into k, herein the k stripes of similar sub-cells, will be used for illustrating the inventive systems and methods of the present disclosure.

The present disclosure relates to two variations of manufacturing lines and processes of PV solar panels:
  a) A conventional solar panel manufacturing line utilizing conventional electric busbars connection technology by using several conductors with round or rectangular cross section, when the soldering and lamination processes are separated. A mostly automatic production line that utilizes common process for producing PV panels with regular solar cells, one can refer to a video in the following link: https://www.solarmakingmachine.com.
  b) A fully automatic, foil-based wiring technology that uses several "Smart Wire" (SW) conductors with round cross section that are embedded in some kind of polymer, such as the "Smart Wire Connection Technology" (SWCT) and the like, where the soldering and lamination processes are incorporated.

Reference is made to FIG. 1a (prior art) that illustrates an example conventional manufacturing technology receptor conveyor 40 that is configured to convey regular solar cells 20. An arm catcher (typically, a "robotic catcher") is configured to place regular solar cells 20, one by one, on a regular receptor conveyor belt 42, wherein regular solar cells 20 are spaced apart by a predesigned gap.

Typically, another robotic catcher (not shown) is configured to picked up the regular solar cells 20, from the receptor conveyor belt 42 and place them on a common stringer conveyer 50 having a common wide stringer conveyer belt 52 configured for a "Busbars Lay-Up" in which step busbars 25 are laid-up on a column of regular solar cells 20 in order to produce a single string having a predesign number of regular solar cells 20 that are electrically connected in series. An example common stringer conveyer 50 is shown in FIG. 1b (prior art). The regular solar cells 20 are placed on common stringer conveyer belt 52 aligned to form a string of regular solar cells 20 spaces apart by predesigned gaps. In the non-limiting example shown in FIG. 1b, the array of regular solar cells 20 includes a string (column) of regular solar cells 20, and by way of a non-limiting example the description refers to an array of 6 such strings (columns), each having 10 regular solar cells 20.

Common stringer conveyer 50 further includes means for placing common wiring busbars 25 along the string of regular solar cells 20 (for example, with no limitations, 10 regular solar cells 20 a number of busbars 25 (typically from 3 to 12 and more). Common stringer conveyer 50 conveys the column of regular solar cells 20 and the busbars 25 through a soldering oven 54 (an example of which is depicted in prior art FIG. 1c), yielding a single string of regular solar cells 20 that are electrically connected in series.

Reference is made to FIG. 2a (prior art) that illustrates an example serial connection of a pair 60 of adjacent regular solar cells 20a and 20b of the same string of regular solar cells 20. Regular solar cells 20a and 20b are connected by a single SW-conductor stripe 65, wherein SW-conductor stripe 65 is mechanically and electrically interconnected in series by a respective SW-conductor stripe 65. FIG. 2b (prior art) is a schematic cross section (AA') illustration showing the pair of regular solar cells 20a and 20b that are interconnected by SW-conductor stripe 65 of the polymer conductor segment 64 having thin wire conductors 62 there inside, and forming a gap $g_a$ between solar cells 20a and 20b. FIG. 2c (prior art) illustrates an example string 61, wherein each pair 60 of adjacent regular solar cells 20a and 20b is serial interconnected, mechanically and electrically, by a respective wide SW-conductor stripe 67.

It should be noted that, as shown in prior art FIGS. 2a, 2b and 2c, the prior art strings of regular solar cells 20 are commonly fabricated individually, one string at a time, including when fabricating the strings of regular solar cell 20 using SWCT polymer technology.

Since there are no production lines for manufacturing panels having a crisscross matrix array of solar sub-calls that are formed by cutting solar regular cells 20 into s solar sub-cells, there is a need for such production lines for manufacturing panels having a crisscross matrix array of solar sub-calls.

SUMMARY OF THE INVENTION

Compared with presently used prior art production lines for producing panels of commonly used ("regular") solar cells, the manufacturing production line of a panel of solar sub-cells that are connected in a crisscross matrix configuration to yield a Solar Sub-cells Crisscross matrix Panel (SSCP), according to the present disclosure, uses similar technological processes and similar materials as commonly used for the production of regular solar cells panels.

The advantages of multiple sub cells arranged in a Solar Sub-cells Crisscross matrix Array (SSCA) of solar sub-cells, over an equivalent panel having regular solar cells, include:

a. Instead of the required quantity of k conductors (also referred to as busbars), and with no increase in the panel inner conduction losses, the solar cells of the present disclosure disclosed production lines may require less busbars l, where l≤k, or with conductive wires having a smaller_cross-section and/or a smaller conductor diameter. For example, instead of round conductors having a diameter "d", the round conductors may quire a reduced diameter "$d_r$", where $d_r$≤d, or alternatively, instead of rectungular conductor with a "q" cross section may require busbars with a smaller cross section, and thereby decreasing the copper consumption and enable the cell more exposure to sun light that enhance the panel power efficiency. For the manufacturing of a SSCP, it is required to cut regular solar cells into s sub-cells (typically depending on the regular cell size, or the cell electrical current level yield, and the desired output voltage $V_{mpp}$ of the entire panel).

b. Instead of the typical 60 cells (being a non-limiting example only) that are connected in series in a regular solar cells panel, the SSCP comprised 60×s sub-cells connected in a crisscross matrix configuration.

c. The present disclosure is described, by way of example only, in terms of a panel of solar sub-cells connected in crisscross matrix configuration that is equivalent to a regular panel having 60 regular solar cells, arranged in 6 strings of 10 regular solar cells each, wherein the solar cells in each string are connected in series. The equivalent SSCP, has similar external dimensions (but may be slightly longer) and where s=4, includes 6 strings of 40 solar sub-cells each. It should be appreciated that s may be 2, 3, 4, 5 or any other number, depending among other things, on the size or electrical current level of the regular solar cells being cut into sub-cells.

It should be further noted that the terms "electrical" or "electrically wired", as used herein refer to the electrical configuration of the matrix, regardless of the physical configuration of the solar cells in the solar panel. Similarly, it should be further noted that the term "physical" as used herein refers to the physical placement of solar cells in the module/panel, regardless of the electrical inter-wiring of the solar cells.

According to the teachings of the present invention there is provided a method for manufacturing a Solar Sub-cells Crisscross matrix Array (SSCA) of solar sub-cells of sub divided solar cells, wherein each row of the SSCA includes n solar sub-cells, and each column of the array of solar sub-cells includes m solar sub-cells, the method includes the following steps of:

a. pre-cutting regular solar cells into s solar sub-cells;
b. placing at least n times m of the solar sub-cells onto a narrow sub-cells receptor conveyer belt configured to carry a stream of the solar sub-cells;
c. transferring m rows of n of the solar sub-cells from the narrow sub-cells receptor conveyor belt to a wide array conveyor belt, one row of the solar sub-cells at a time, forming thereon the wide layup conveyer an array of the solar sub-cells, wherein the array of the solar sub-cells includes n columns of the solar sub-cells, and wherein each of the columns includes m of the solar sub-cells;
d. placing n busbars or groups of Smart Wire (SW) conductors on each of the n columns of the solar sub-cells to thereby electrically connect the columns of the solar sub-cells in series;
e. placing short parallel jumpers between all pairs of neighboring the solar sub-cells in each of the m rows of the solar sub-cells;
f. placing wide transverse conductors for parallel connection of the n column and for diodes connection; and
g. soldering the n×m matrix array of the solar sub-cells with the short parallel jumpers and the wide transverse conductors, to thereby form a soldered SSCA of n strings and m rows.

The method for manufacturing a SSCA of claim 1, wherein a predesigned gap $g_2$ is formed between the solar sub-cells placed onto the narrow sub-cells receptor conveyer belt.

Preferably, a predesigned gap $g_1$ is formed between the solar sub-cells in each column of the solar sub-cells placed onto the wide array conveyor belt.

Optionally, the placement of the solar sub-cells onto the narrow sub-cells receptor conveyer belt is carried out by a single-sub-cell catcher.

Preferably, the gap formed between the solar sub-cells of each of the rows is the predesigned gap $g_2$.

Optionally, the transfer of m rows of n of the solar sub-cells from the narrow sub-cells receptor conveyor belt to the wide array conveyor belt, is carried out by a row-sub-cells catcher.

The electrical interconnection of the solar sub-cells may be carried out utilizing conventional electric wiring-based technologies, wherein the placement of the short parallel jumpers may be carried out by a jumpers-catcher. The placement of the n busbars on each of the n columns of the solar sub-cells is carried out at a busbars-layup station, by using 1 to n busbars roles, available at the busbars-layup station.

The placement of wide transverse conductors may be carried out by a wide-conductors catcher.

The soldering of the wide transverse conductors may be carried out by a parallel-bars soldering oven.

The soldering of the n×m matrix array of the solar sub-cells with the short parallel jumpers and the wide transverse conductors, is typically carried out by an array soldering oven.

Optionally, the placed the short parallel jumpers are kept in position using an affixing means selected from the group including conductive glue and a vacuum matrix table.

The electrical interconnection of the solar sub-cells may also be carried out utilizing Smart Wire Connection Technologies (SWCT) based wiring. The electrical interconnection of the solar sub-cells in series may be carried out by a narrow SW-conductor that is placed over one solar sub-cell and beneath the second solar sub-cell of each pair of solar sub-cells in all columns of the SSCA, or by a wide SW-conductor that is placed over one row of the solar sub-cell and beneath the second row of the solar sub-cell of each pair of the m rows of SSCA.

When using a narrow-conductor, the placement of the narrow SW-conductor on each of the pair of the solar sub-cells is typically carried out at a SW-conductors layup station. The placement of the narrow SW-conductors on respective pairs of each pair of the solar sub-cells in all columns of the SSCA, may include the following steps:

a. after the first row of the n solar sub-cells is placed in position at the SW-conductors layup station, placing a narrow SW-conductor onto each of the solar sub-cell, such that the position designated for the second row of the solar sub-cell, of the same column of the solar sub-cells, is covered by the remainder of the placed SW-conductor;

b. placing the second row of the solar sub-cell onto the remainder of the placed SW-conductor;

c. placing a narrow SW-conductor onto each of the solar sub-cell of the second row, such that the position designated for the next row of the solar sub-cell, of the same column of the solar sub-cells, is covered by the remainder of the recently placed SW-conductor; and d. continue the repeating step (c) until all m solar sub-cells in each of the n columns are interconnected by the respective m (or m−1) of the narrow SW-conductor.

Optionally, the narrow SW-conductor is manufactured as single foil having a single group of SW-conductors.

When using a wide SW-conductor, the wide SW-conductor is predesigned to be placed over one row of the solar sub-cell and beneath the second row of the solar sub-cell of each pair of the m rows of SSCA. The placement of the n incorporated groups of SW-conductors on each of the n columns of the solar sub-cells is carried out at a SW-conductors layup station. The placement of the wide SW-conductors on respective pairs of each of the pair of solar sub-cells in all columns of the SSCA, including the steps of:

a. after the first row of the n solar sub-cells is placed in position at the SW-conductors layup station, placing a wide SW-conductor onto the of first row of the solar sub-cell, such that the position designated for the second row of the solar sub-cell, is covered by the remainder of the placed wide SW-conductors;

b. placing the second row of the solar sub-cell onto the remainder of the placed wide SW-conductors;

c. placing a wide SW-conductors onto the second row of the solar sub-cells, such that the position designated for the next row of the solar sub-cells, is covered by the remainder of the recently placed wide SW-conductors; and d. continue the repeating step (c) until all m solar sub-cells in each of the n columns are interconnected by the respective m (or m−1) of the SW-conductor.

Preferably, the n groups of SW-conductors of the wide SW-conductors are manufactured as single foils.

Preferably, the short parallel jumpers and the wide transverse conductors are incorporated into a wide parallel connections polymer sheet.

Optionally, the wide parallel connections polymer sheet is placed on the SW-conductors layup conveyor belt before placing the first row of the solar sub-cells.

Optionally, the wide parallel connections polymer sheet is placed on the SW-conductors that have been placed of each column of the solar sub-cells.

The SSCA is then conveyed through a soldering oven, forming a soldered SSCA.

According to further teachings of the present invention there is provided a production line system for manufacturing a Solar Sub-cells Crisscross matrix Array (SSCA) of solar sub-cells, wherein each row of the SSCA includes n solar sub-cells, and each column of the array of solar sub-cells includes m solar sub-cells, the system including:

a. a narrow sub-cells receptor conveyer belt configured to receive a stream of the solar sub-cells;

b. a robotic row-catcher configured to transfer rows of n of the solar sub-cells from the narrow sub-cells receptor conveyor belt to a wide array conveyor belt, one row of the solar sub-cells at a time;

c. means for placing n busbars or groups of Smart Wire (SW) conductors on each of the n columns of the solar sub-cells to thereby electrically connect the columns of the solar sub-cells in series;

d. a robotic jumpers-catcher configured to place short parallel jumpers between all pairs of neighboring the solar sub-cells in each of the m rows of the solar sub-cells;

e. a transverse conductors catcher configured to place wide transverse conductors for parallel connection of the n column and for diodes connection; and f. a soldering oven configure to solder the n×m matrix array of the solar sub-cells with the short parallel jumpers and the wide transverse conductors, to thereby form a soldered SSCA of n strings and m rows.

BRIEF DESCRIPTION OF THE DRAWINGS

The present invention will become fully understood from the detailed description given herein below and the accompanying drawings, which are given by way of illustration and example only, and thus not limiting in any way, wherein:

FIG. 2a (prior art) illustrates an example serial connection of a pair of adjacent regular solar cells the same string of regular solar cells.

FIG. 2b (prior art) is a schematic cross section (AA') illustration showing the pair of regular solar cells that are interconnected by a SW-conductor stripe.

FIG. 2c (prior art) illustrates an example string of regular solar cells, wherein each pair of adjacent regular solar cells is serially connected, mechanically and electrically, by a respective SW-conductor stripe.

DETAILED DESCRIPTION OF THE INVENTION

The present invention now will be described more fully hereinafter with reference to the accompanying drawings, in which preferred embodiments of the invention are shown.

Figure 3:
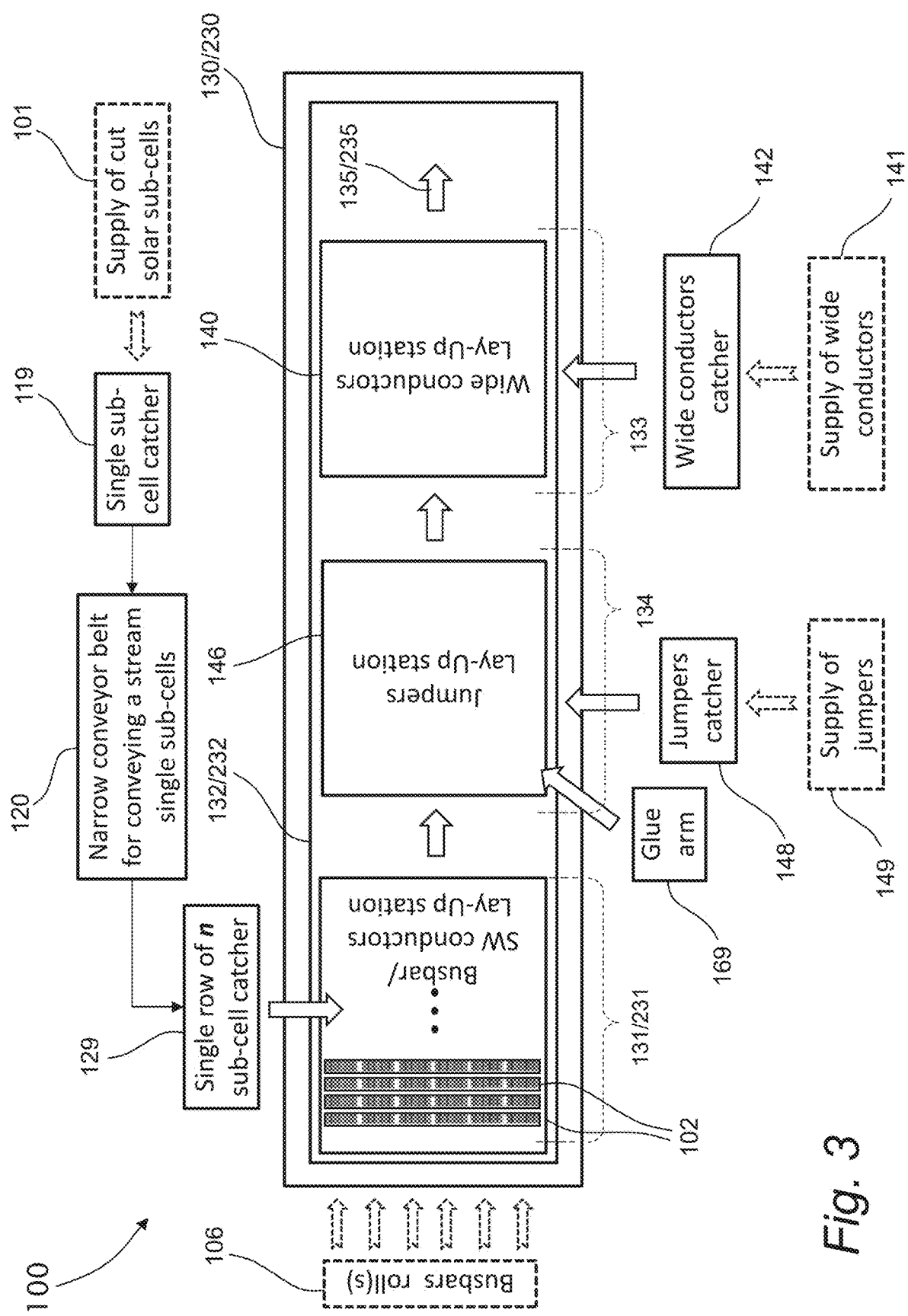
FIG. 3 illustrates an example flow of action in stations of an example diagram of a stringer machine being a portion of a production line (partially shown) for manufacturing a Solar Sub-cells Crisscross matrix Array (SSCA) of solar sub-cells, according to some embodiments of the present invention.
Figure 4A:
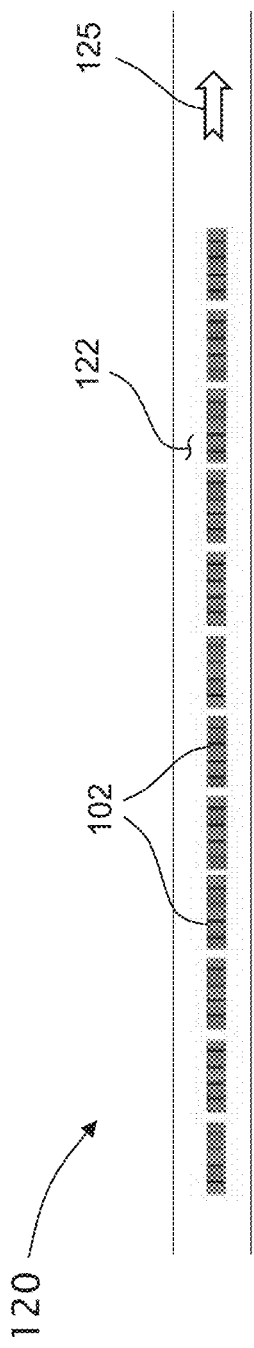
FIG. 4a is a schematic illustration of an example narrow-sub-cells receptor conveyor belt, according to embodiments of the present invention.

Reference is made back to the drawings. FIG. 3 illustrates an example flow of action in stations of an example diagram of a stringer machine 130 being a portion of a production line 100 (partially shown) for manufacturing a Solar Sub-cells Crisscross matrix Array (SSCA) of solar sub-cells 102. Production line 100 includes a narrow sub-cells receptor conveyor belt 120 configured to receive and convey solar sub-cells 102 in a direction 135, for example by a single-sub-cell catcher 119 that picks up pre-cut solar sub-cells 102, one by one, from a supply 101 of cut solar sub-cells 102, places the solar sub-cells 102, one by one, on narrow-sub-cells receptor conveyor belt 120 as also illustrated in FIG. 4a, and wherein solar sub-cells 102 are spaced apart by a predesigned gap $g_2$, according to embodiments of the present invention.

Figure 4B:
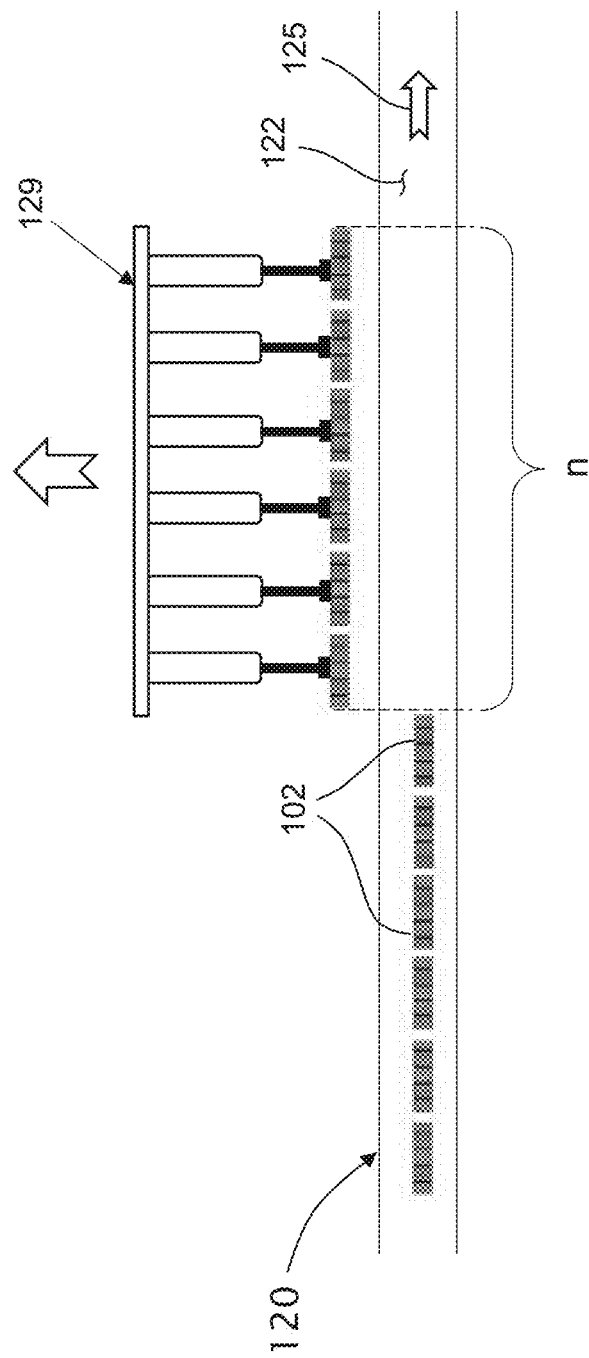
FIG. 4b is a schematic illustration of an example narrow-sub-cells receptor conveyor belt, according to embodiments of the present invention, wherein a robotic row-is shown picking up a row of solar sub-cells.

Typically, a robotic row-catcher (such as robotic catcher 129 shown by way of example in FIG. 4b) is configured to pick up, from narrow-sub-cells receptor conveyor belt 120, one row of n solar sub-cells 102 at a time, wherein each row of solar sub-cells consists of n solar sub-cells 102, and the robotic row-catcher 129 is further configured place, row after row, m such rows of solar sub-cells 102 on a wide array conveyor belt 132, wherein the rows of solar sub-cells 102 are spaced apart therebetween by a predesigned gap $g_1$ and the solar sub-cells 102 in each row are spaced apart by a predesigned gap $g_2$ for the designated solar panel.

Figure 5:
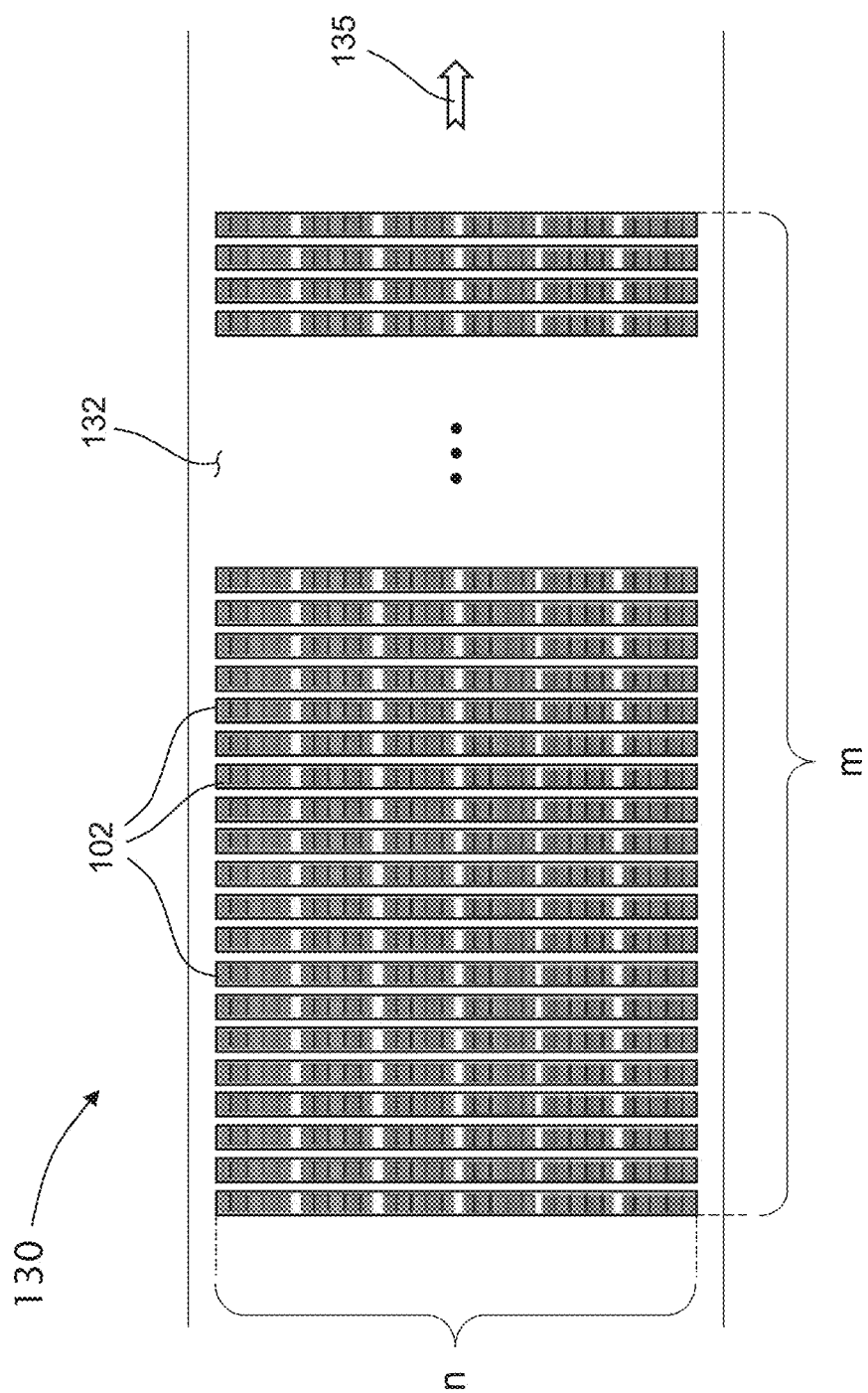
FIG. 5, which illustrates an example upper view of wide array conveyor belt, situated at a busbars layup station that is configured for busbars layup, according to some embodiments of the present invention.

Reference is also made to FIG. 5, which illustrates an example upper view of wide array conveyor belt 132 situated at a busbars layup station 131 that is configured for busbars layup, wherein wide array conveyor belt 132 is part a stringer machine 130. At the busbars layup station 131 wide array conveyor belt 132 is configured to receive and convey an array of solar sub-cells 102 in a direction 135, wherein the array of solar sub-cells 102 is predesigned to consist of m rows and n columns of solar sub-cells 102 (required for the production of the designated SSCP). The array of solar sub-cells 102 is placed on a wide array conveyer belt 132, wherein the solar sub-cells 102 are spaced apart by gaps as predesigned for the designated panel of a SSCA of solar sub-cells 102, in which SSCA of the sub-cells 102 are electrically interconnected both serially and in parallelly. After all m rows of solar sub-cells 102 have been placed on wide array conveyor belt 132, an array of m×n sub-cells 102 is positioned on wide array conveyer belt 132, the array having m rows of solar sub-cells 102 and n strings of solar sub-cells 102 to simultaneously fabricate in a same time a "n" strings of regular solar cells 20.

It should be appreciated that in prior art production lines of regular solar cell 20, the conveyor belt 52 of the stringer machine 50is configured to receive a single regular solar cell 20, and to fabricate a single string of regular solar cells 20.

It should be noted that each solar sub-cell 102, in each row of n solar sub-cells 102, that placed on wide array conveyor belt 132, is designated to be a member of a different string of solar sub-cells 102. Hence, the width of a row defines the required width of the entire wide array conveyor belt 132, as well as the width of the PV panel being produced. It should be appreciated that apart from the conventional manufacturing technology receptor conveyor 40 that is intended for single regular solar cells, most of the other facilities of the regular production line are built in the width of the entire panel being produced.

Figure 1A:
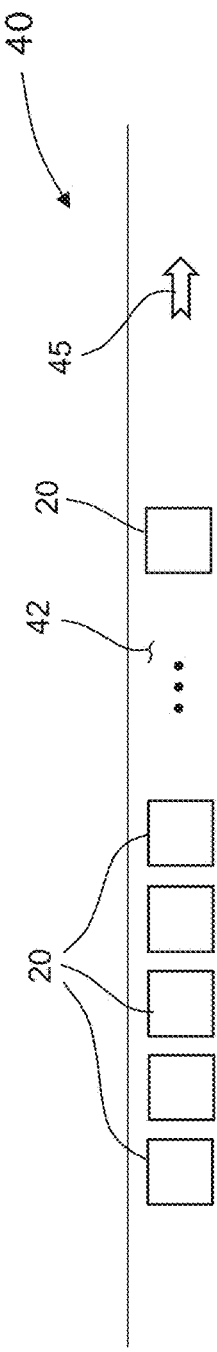
FIG. 1a (prior art) is a schematic illustration of illustrates an example conventional manufacturing technology receptor conveyor that is configured to convey regular solar cells.
Figure 1B:
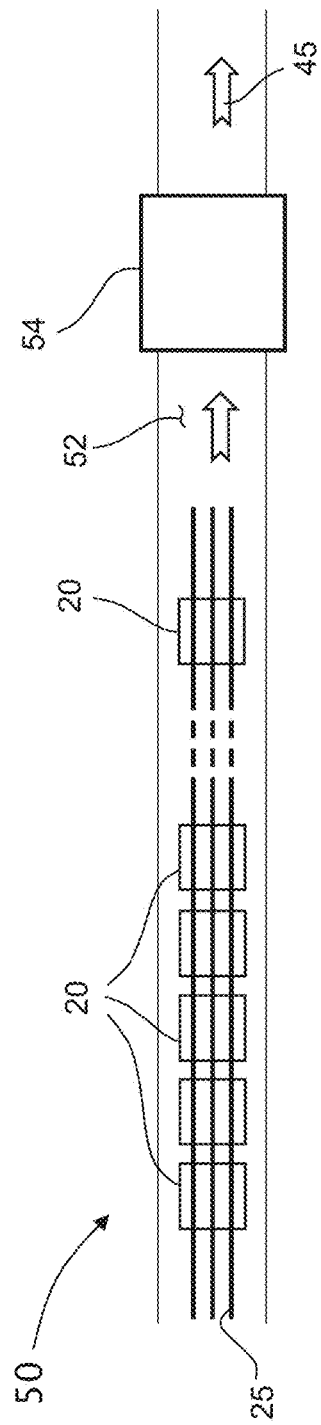
FIG. 1b (prior art) is a schematic illustration of illustrates an example conventional manufacturing technology receptor conveyor that is configured to convey regular solar cells.
Figure 1C:
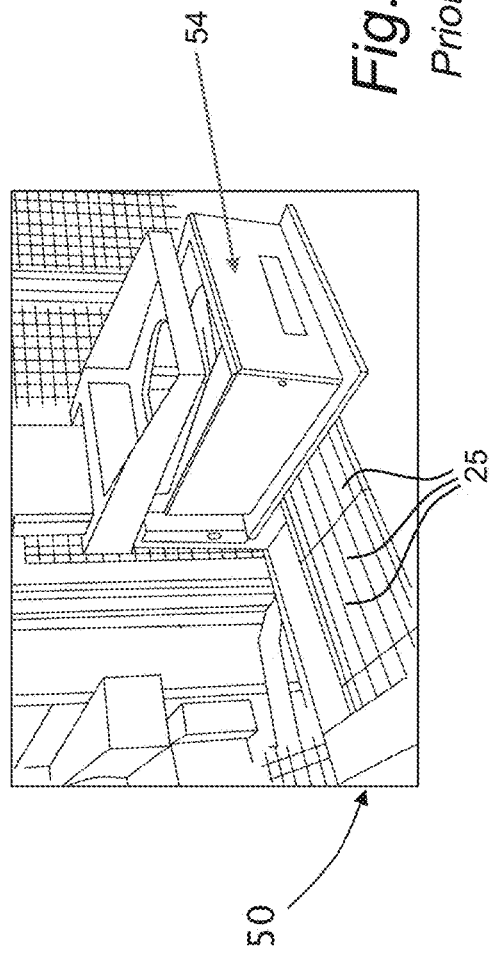
FIG. 1c (prior art) depicts an example common stringer conveyer that conveys the column of regular solar cells and busbars through a soldering oven.

It should be further noted that for convenience and clarity only, and by way of a non-limiting example only, the description often refers to an array of solar sub-cells 102 (required for the production of the designated SSCP) of n=6 strings (columns), each having m=40 solar sub-cells 102 (yield by cutting each regular solar cells 20 into 4 stripes of similar sub-cells 102), being equivalent in power production to the example array of 6 strings (columns), each having 10 regular solar cells 20, as shown with reference to FIG. 1*b*.

Figure 6:
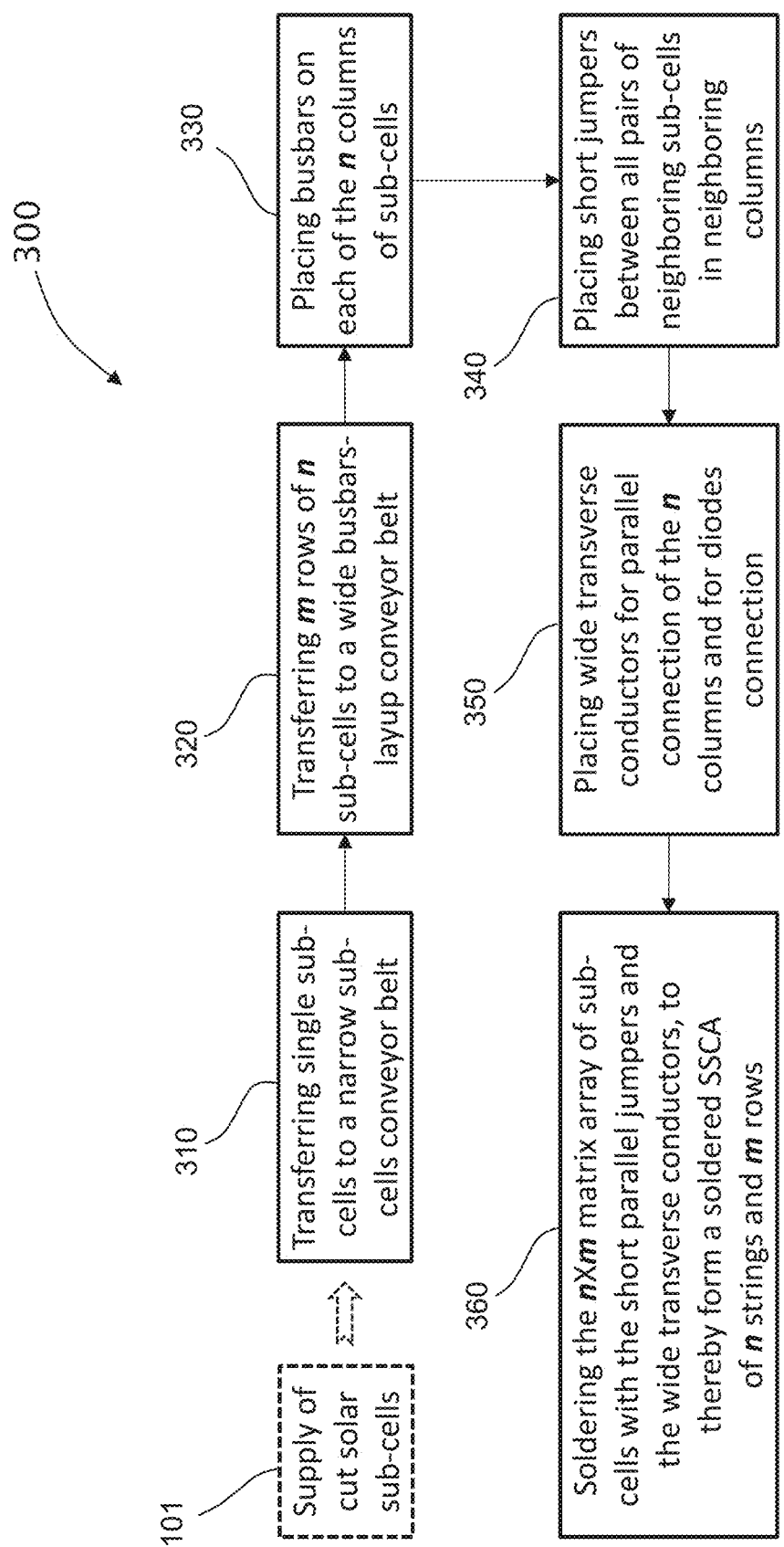
FIG. 6 illustrates an example flow of action method for manufacturing a SSCA of solar sub-cells, using a production line as shown in FIG. 3, according to some embodiments of the present invention.

Reference is made back to FIG. 6, which illustrates an example flow of action method 300 for manufacturing a SSCA of solar sub-cells 102, using production line 100, wherein method 300 includes the following steps:

step 310: Transferring single sub-cells 102 to a narrow sub-cells conveyor belt 120, as described here above.

step 320: Transferring m rows of n sub-cells 102 to wide array conveyor belt 132, wherein wide array conveyor belt 132 is situated at busbars-layup station 131.

step 330: Placing busbars 105 over each of the n columns of solar sub-cells 102.

step 340: Placing short jumpers between all pairs of neighboring sub-cells 102 of neighboring strings of solar sub-cells 102.

step 350: Placing wide transverse conductors over the array of solar sub-cells 102, for parallel connection of the n strings of solar sub-cells 102 and for diodes connection.

It should be appreciated that step 350 may precede step 340.

step 360: Soldering the n×m array of solar sub-cells 102 with the short parallel jumpers and the wide transverse conductors, to thereby form a soldered crisscross matrix array of solar sub-cells 102.

Figure 7:
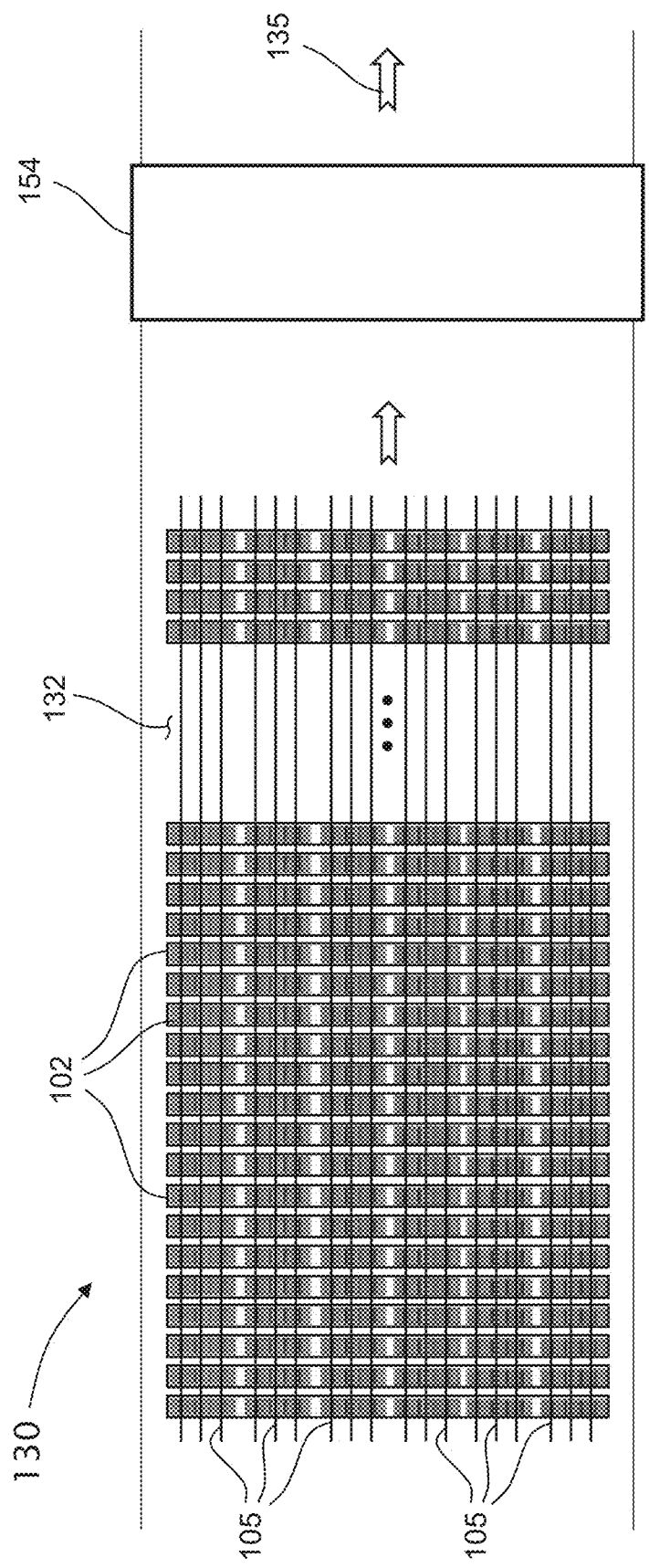
FIG. 7 illustrates a busbars-layup station, wherein a wide array conveyor belt situated at the busbars-layup station, and wherein the busbars layup station is configured for a "Busbars Lay-Up" process, according to some embodiments of the present invention.

Referring now to FIG. 7, that illustrating a busbars-layup station 131 of stringer machine station 130, wherein wide array conveyor belt 132 is situated at the busbars-layup station 131, and wherein busbars (105) layup station 131 is configured for a "Busbars Lay-Up" process, and wherein in step 330, a busbars 105 is laid-up over each string of solar sub-cells 102, in order to produce the n strings of the predesign number (m) of solar sub-cells 102 that are electrically connected in series. It should be appreciated that a busbars 105 may include z busbars-wires, where z>1. It should be appreciated that while producing a panel of regular solar cells 20, in the commonly used "Busbars Lay-Up" station, only one string of regular solar cells 20 is formed, while the stringer machine 130 produces n strings solar sub-cells 102 at busbars-layup station 131, and preferably, at a same time.

Once the "Busbars Lay-Up" step 330 is completed, the stringer machine 130 may convey (in direction 135) the array of solar sub-cells 102, the busbars 105 through a soldering oven 154, simultaneously yielding n strings solar sub-cells 102. However, the strings still lack parallel connections thereof.

Figure 8:
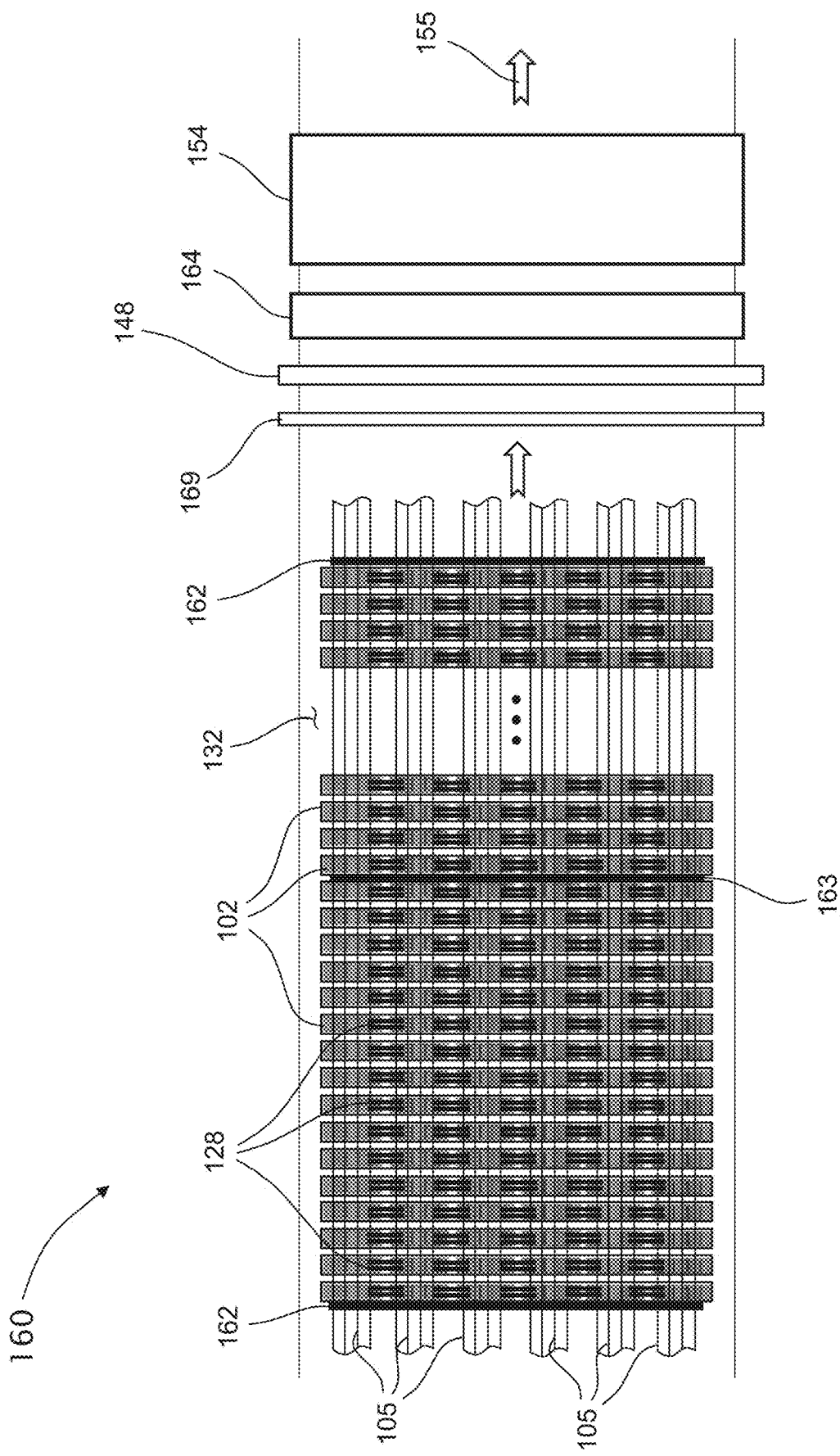
FIG. 8 illustrates wide array conveyer belt situated at a jumpers-layup station, according to embodiments of the present invention.

Preferably, before conveying the array of solar sub-cells 102 and busbars 105 and short transverse jumpers 128 through soldering oven 154, with reference also to FIG. 8, wide array conveyer belt 132 further conveys the array of solar sub-cells 102 to a jumpers-layup station 134 that is configured to yield a CCSA ready array layup. In step 340 of method 300, a special glue-arm 169 (that is typically configured to go up and down) having a sponge that has been dipped or covered by a special conductive glue, applies conductive glue spots on busbars 105 at preconfigured appropriate places predesigned to receive additional transverse short jumpers 128 designated to connect the sub-cells in parallel, configured to apply at the sunny side of the solar sub-cells 102, which locations are predesigned to respectively receive short transverse jumpers 128.

Using a transverse jumpers-catcher, such as robotic jumpers-catcher 148 (schematically shown by way of example in FIGS. 3 and 8), designated to connect sub-cells 102 in parallel by the respective short transverse jumpers 128, placing short transverse jumpers 128 (conductors that are without any glue), in the respective conductive glue spots, at designated locations on the strings of solar sub-cells 102, which conductive glue spots define the soldering points for soldering the respective wide transverse conductors.

Figure 9:
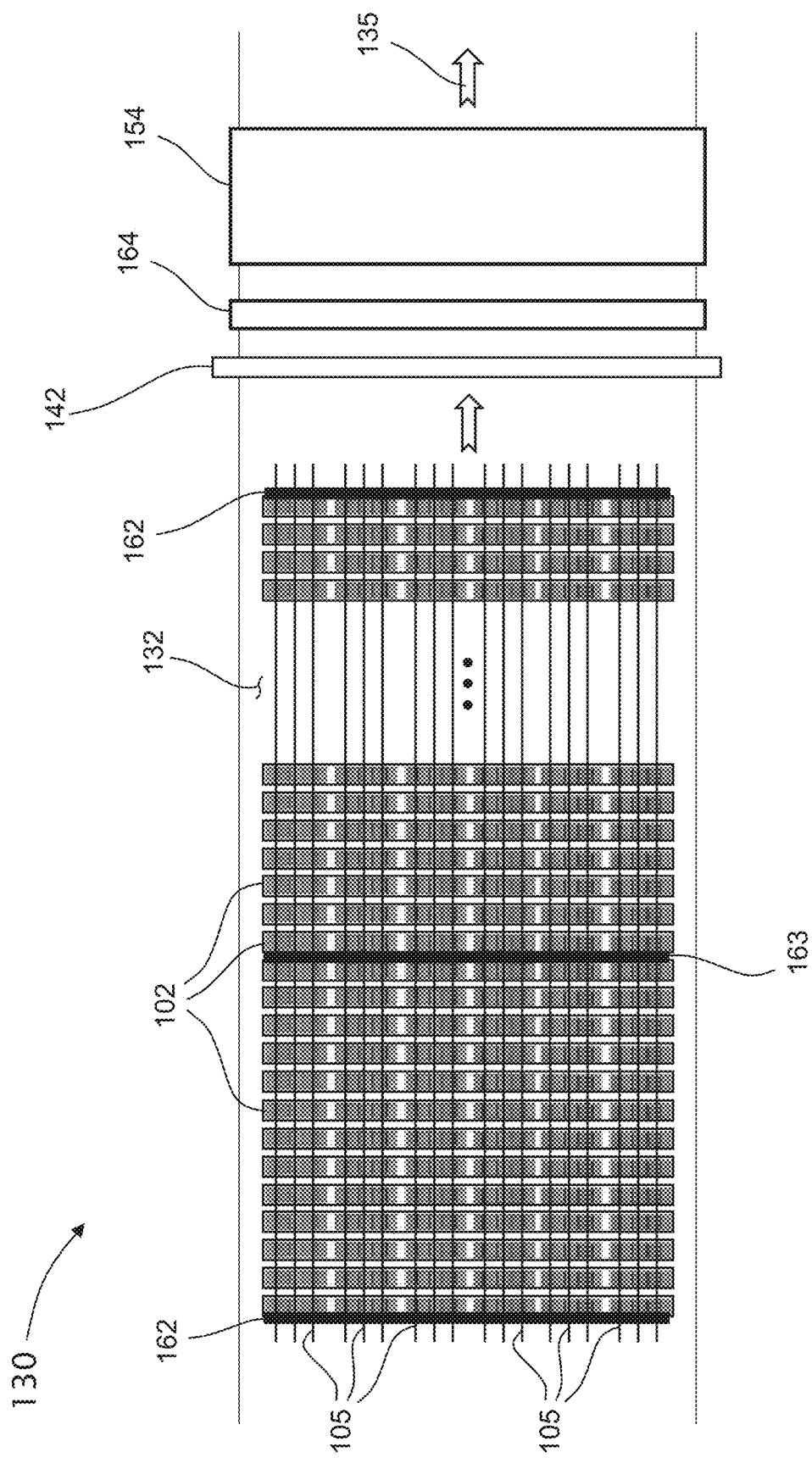
FIG. 9 illustrates wide array conveyer belt situated at a wide-conductors-layup station that is configured to yield a CCSA ready array layup, according to embodiments of the present invention.
Figure 10:
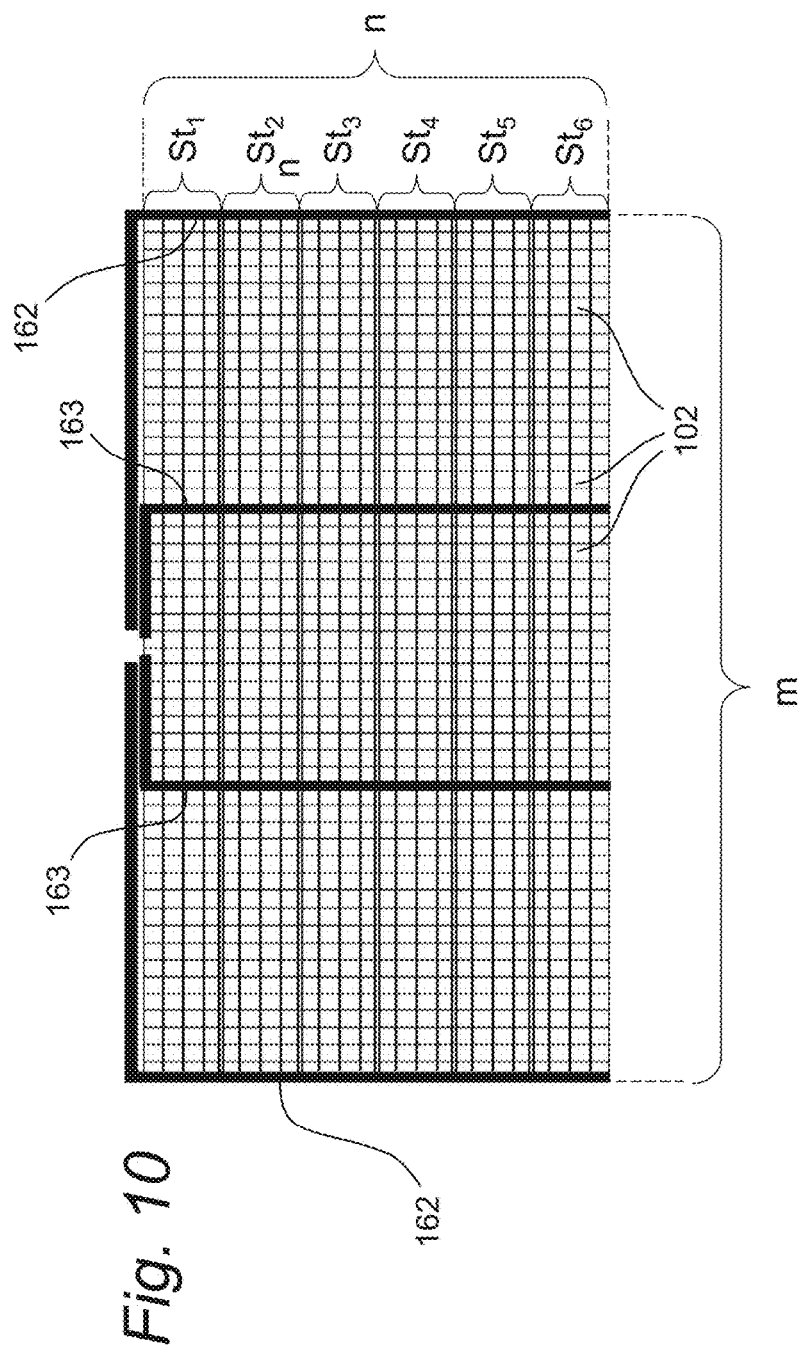
FIG. 10 illustrates wide transverse laid over an array of solar sub-sells, according to embodiments of the present invention.
Figure 11:
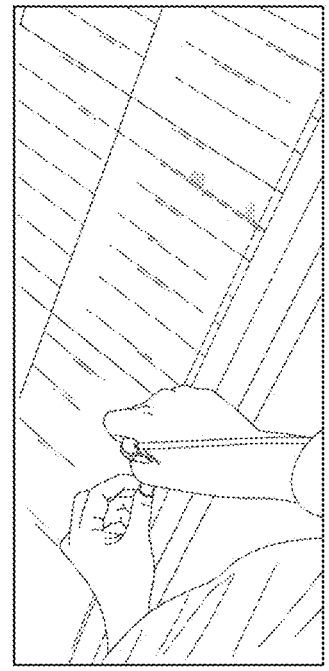
FIG. 11 depict an example of prior art diode connection.

Preferably, before conveying the array of solar sub-cells 102 and busbars 105 and short transverse jumpers 128 through a soldering oven 154, with reference also to FIGS. 9 and 10, stringer machine 130 further includes a step 350 of placing four (with no limitations) additional wide transverse conductors (162, 163) at a wide conductors-layup station 133, using a transverse conductors catcher, such as robotic catcher 142 (schematically shown by way of example in FIGS. 3 and 9), for parallel connection of the n strings (St$_1$, St$_2$, St$_3$, . . . , St$_6$,) by wide transverse conductors 162 and for diodes connection by wide transverse conductors 163 (see an example depicted in FIG. 11). Stringer machine 130 may further include a (typically narrow) parallel-bars soldering oven 164 (schematically shown by way of example in FIG. 9) that is configured to solder the wide transverse conductors (162, 163), and is typically positioned before soldering oven 154. Parallel-bars soldering oven 164 is configured to operate in predesigned time slots for soldering the wide transverse conductors (162, 163). In some embodiments the parallel-bars soldering oven 164 and the array soldering oven 154 may be combined into a single oven. It should be appreciated that the step (step 350) of placing the wide transverse conductors (162, 163) over the array of solar sub-cells 102, may precede the step (step 340) of placing the short transverse jumpers 128 between all pairs of neighboring sub-cells 102 of neighboring strings of solar sub-cells 102.

It should be noted that the wide array conveyor belt 132 with robotic jumpers-catcher 148 and robotic wide conductors catcher 142 may be replaced by a "Vacuum matrix table", wherein before the soldering (step 360) an automatic pincer system holds all of the short transverse jumpers 128 in position, in order to connect, in parallel, all of the neighboring sub-cells 102 of the n strings of solar sub-cells 102 with the sunny side of solar sub-cells 102 facing up, each string having m rows.

Wide array conveyer belt 132 can then convey the array of solar sub-cells 102 and busbars 105, and short transverse jumpers 128, and wide transverse conductors 162 and 163, through soldering oven 154 (step 360) that is typically configured to solder s rows (for example only) of the n strings, at a time.

In another option, at this stage, after the array of solar sub-cells 102, busbars 105 and wide transverse conductors (162, 163) have been soldered, the entire array of the n strings (St$_1$, St$_2$, St$_3$, . . . , St$_6$,) and the wide transverse conductors (162, 163), is flipped over and placed back onto another wide array jumpers-conveyor belt 183, with the sunny side of solar sub-cells 102 facing down.

Figure 12:
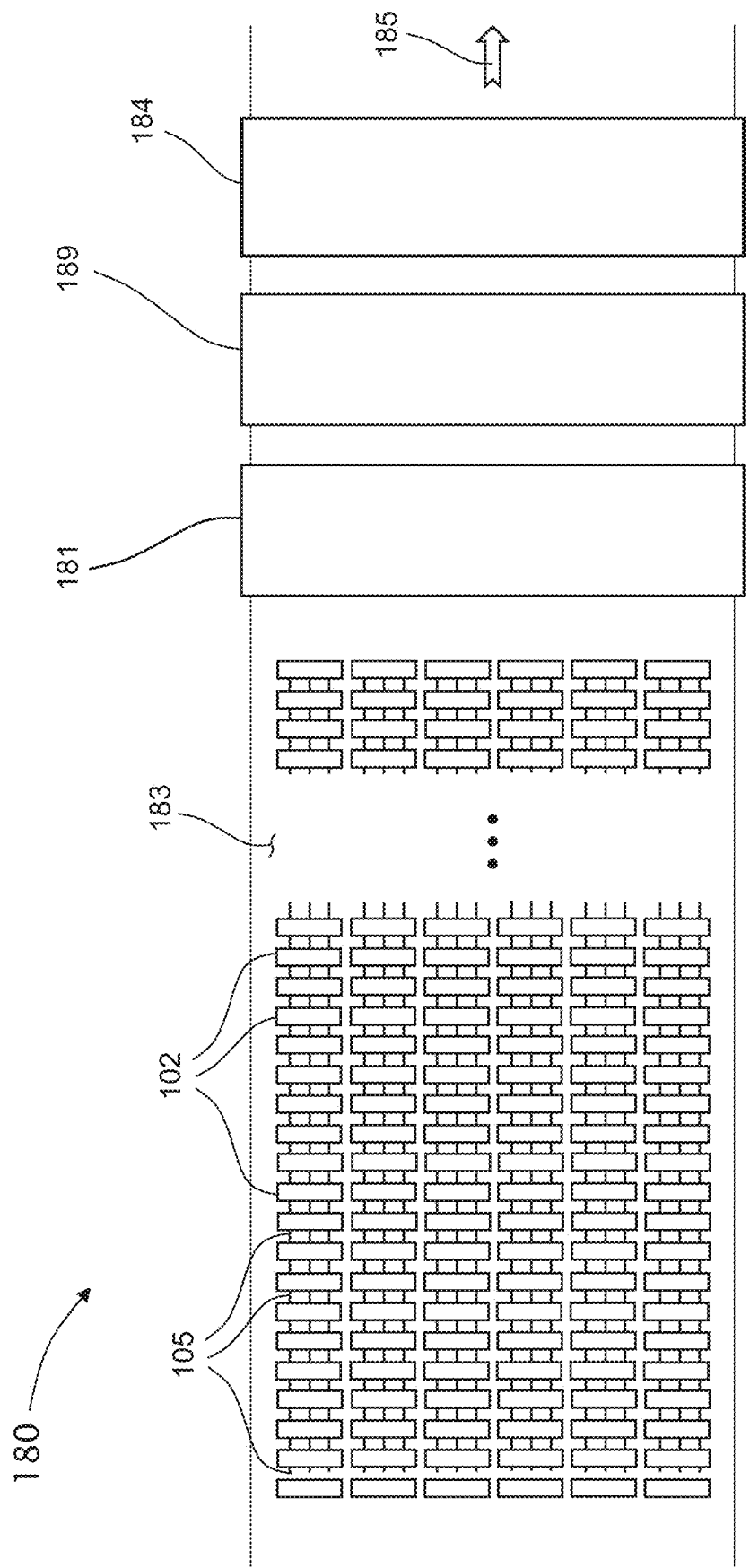
FIG. 12 illustrates an example array of solar sub-cells being flipped over and placed on another wide array conveyor belt, wherein the sunny side of solar sub-cells faces down.
Figure 13A:
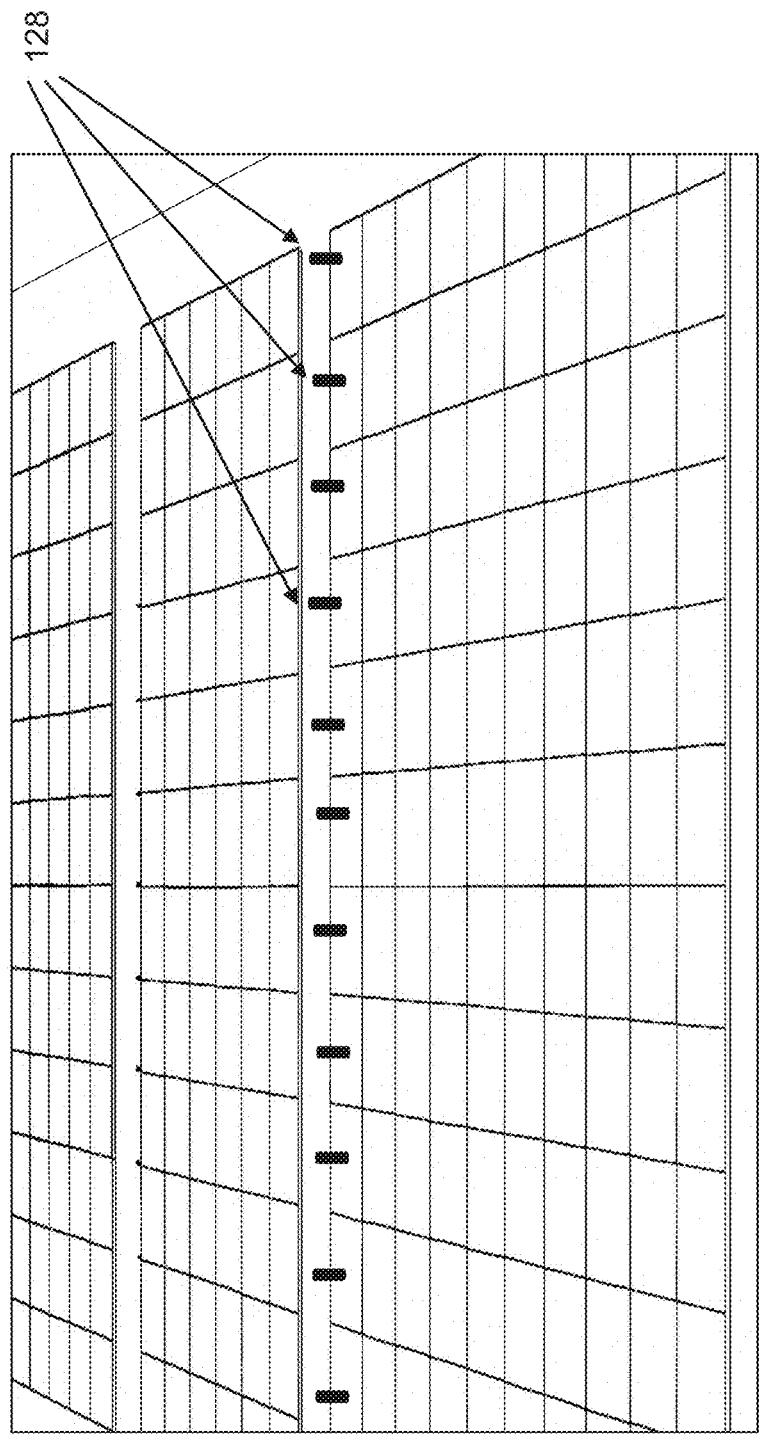
FIG. 13a depicts an example placement of short transverse jumpers at respective designated locations places that are pre-covered with conductive glue.
Figure 13B:
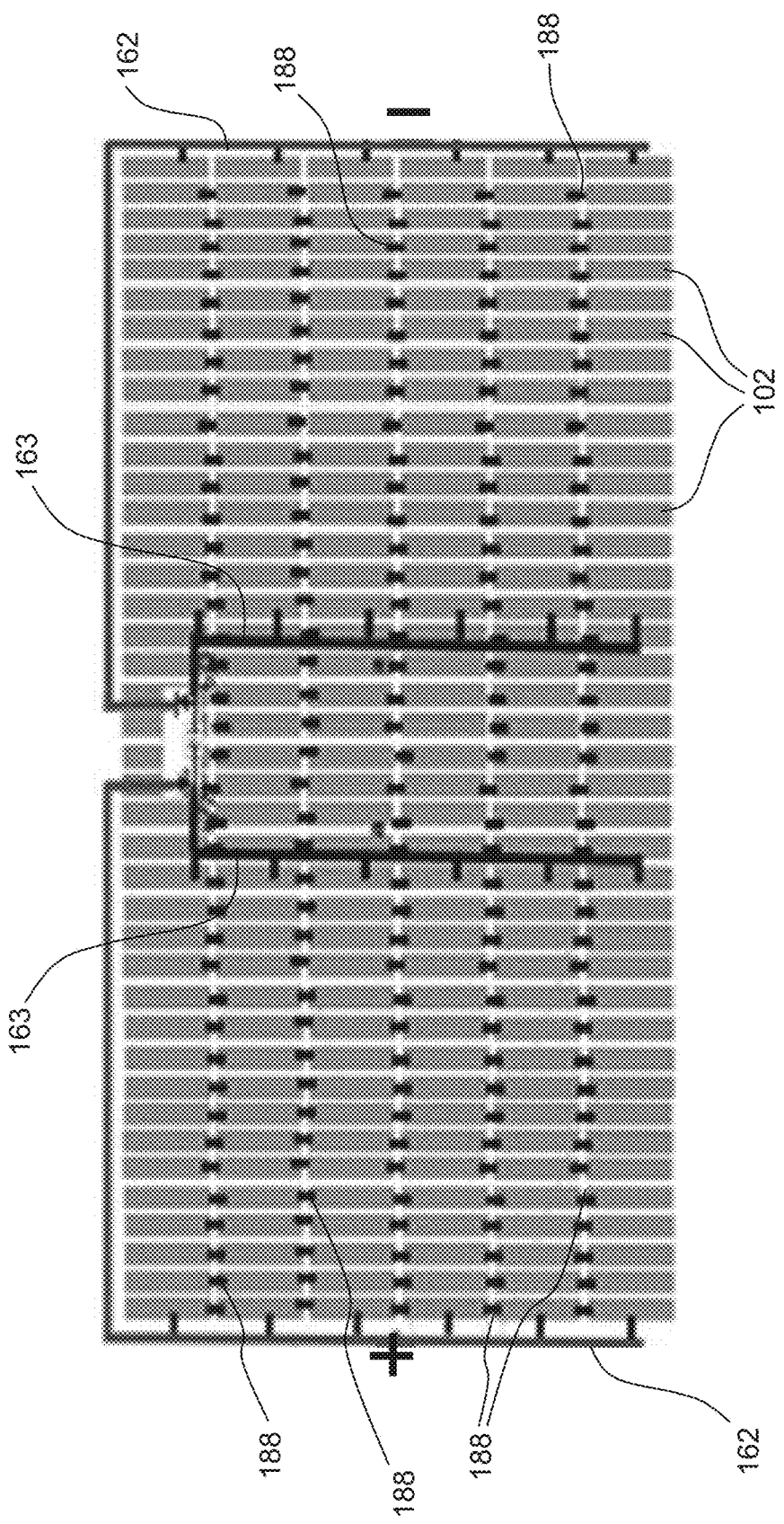
FIG. 13b illustrates an example view of the non-illuminated side of an interconnected, soldered SSCA having 6 strings and 40 rows.

Reference is now also made to FIG. 12, illustrating the array solar sub-cells 102 being flipped over and placed on another wide array conveyor belt 183, wherein the sunny side of solar sub-cells 102 faces down. The wide array conveyor belt 183 further includes a wide jumpers-arm 181 configured to apply conductive glue at the back side of the solar sub-cells 102, which locations are predesigned to respectively receive short transverse jumpers 128. This section of wide array conveyor belt 183 further includes a wide jumpers-catcher 189 that is configured to lay short transverse jumpers 128 at respective designated locations places that are pre-covered with conductive glue (see an example depicted in FIG. 13*a*), to thereby individually connect solar sub-cells 102 in parallel, and thereby form a SSCA of solar sub-cells 102. The s (four in our non-limiting example) rows of solar sub-cells 102 are then conveyed through a main soldering oven 184, in direction 185, yielding a SSCA of solar sub-cells 102, in which crisscross matrix array of solar sub-cells 102 each solar cell 102 is electrically connected both in series and parallel. FIG. 13b illustrates an example view of the non-illuminated side of an interconnected, soldered SSCA having 6 strings and 40 rows.

It should be appreciated that while the current s rows of solar sub-cells 102 are being soldered by main soldering oven 184, the next s rows of solar sub-cells 102 may by applied with conductive adhesive on the next group of s rows of solar sub-cells 102, at the respective preconfigured location.

It should be noted that the wide array conveyor belt 183 may be replaced by a "vacuum matrix table", where the automatic pincer system positioning soldered CCSA having n strings and m rows in the Vacuum matrix table on the back of the sub-cells in order to jumper in parallel the all-neighboring sub-cells of the six strings. Wide array conveyer belt 183 then convey the array of solar sub-cells 102 and busbars 105, and wide transverse conductors 162, and 163, and short transverse jumpers 128 through soldering oven 184 that is typically configured to solder s rows (for example only) of the n strings, at a time.

It should be appreciated that during the "Busbars Lay-Up" stage, the parallel connection of the six strings of solar sub-cells 102 with the wide transverse conductors (162, 163), minimizes the manual assembling process and thereby reduce the manufacturing cost.

It should be further appreciated that due to the parallel connecting of jumpers and wide transverse conductors that are bonded to the busbars with adhesive, the strings of solar sub-cells 102 that are connected in parallel probably do not need mechanical fixing, compared to the separate strings of the regular solar cells manufacturing process. This also reduces the manual working manufacturing cost.

It should be further appreciated that the gaps $g_2$ formed between each of the adjacent solar sub-cells of adjacent strings of solar sub-cells can be minimized due to all-neighboring sub-cells parallel connection, compared to the gaps required between the strings of regular solar cells.

Reference is now made to another embodiment variation of the present disclosure. In this variation, the SSCA of solar sub-cells 102 utilizes a foil-based Smart Wiring (SW) wiring technology that uses several thin conductors, (typically 18 thin conductors per string) and typically with a round cross section, that are embedded in some kind of polymer, for all of the solar sub-cells 102 electrical interconnections, including the interconnecting the strings of solar sub-cells 102. It should be appreciated that in the foil-based embodiment variation of the present disclosure, all of the crisscross wiring of the crisscross matrix connections, including the parallel connections by wide transverse conductors (162, 163), are typically done at the light receiving side of the solar sub-cells 102 (but may be done on a back side of the solar sub-cells 102), while using the foil-based SW. The interconnection of all of the wirings at the same side, i.e. at the light receiving side (or alternatively on the back side) of the solar sub-cells 102, is facilitated due to using the foil-based SW wiring technology.

Reference is also made back to FIG. 3, wherein FIG. 3 illustrates a portion of an example conveyor belt 232 (situated at the SW-conductors layup station 231), being part of a stringer machine 230.

Figure 14A:
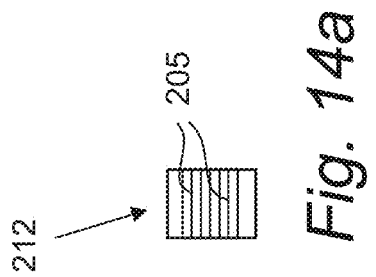
FIG. 14a illustrates an example SW-conductor that is configured to mechanically and electrically connect two adjacent solar sub-cells in series, wherein these two adjacent solar sub-cells belong to the same column of solar sub-cells, in order to produce a single string having a predesign number of solar sub-cells, according to some embodiments of the present invention.

FIG. 14a illustrates an example SW-conductor 212 (designated to fulfil the same function as busbars do when forming a coventional string of solar cells) that is configured to mechanically and electrically connect two adjacent solar sub-cells 102 in series, wherein these two adjacent solar sub-cells 102 belong to a column of solar sub-cells 102 in order to produce a single string having a predesign number of solar sub-cells 102.

Figure 14B:
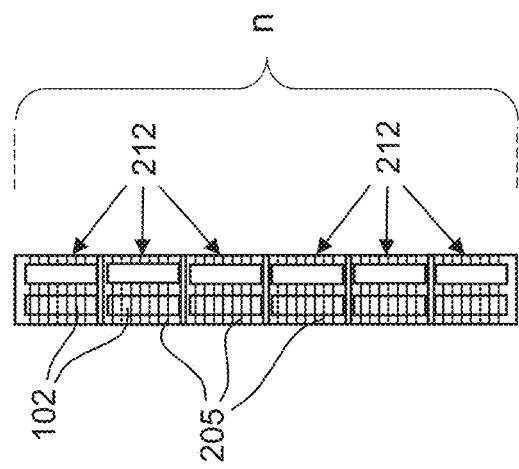
FIG. 14b illustrates an example row of n pairs of solar sub-cells, wherein each pair of solar sub-cells is coupled with a respective SW-conductor that is configured to mechanically and electrically connect the respective two adjacent solar sub-cells in series, wherein these two adjacent solar sub-cells belong to the same column of solar sub-cells in order to produce a respective single string having a predesign number of solar sub-cells, according to some embodiments of the present invention.

FIG. 14b illustrates an example row of n pairs of solar sub-cells 102, wherein each pair of solar sub-cells 102 of two adjacent rows of sub cells is coupled with a respective narrow SW-conductor 212, having the same width of a solar sub-cell width, that is configured to mechanically and electrically connect the respective two adjacent solar sub-cells 102 of two adjacent rows of sub cells in series, wherein these two adjacent solar sub-cells 102 belong to the respective column of solar sub-cells 102 in order to produce a respective single string having a predesign number of solar sub-cells 102.

In a non-limiting example embodiment variation of the present disclosure that is related to utilizing the narrow SW-conductor 212, and that is configured to mechanically and electrically connect each pair of the neighboring cells of two adjacent rows of n sub-cells, where these rows are placed row after row and connected by the narrow SW-conductor 212, as illustrated on FIG. 2a, 2b, 2c (Prior art). It should be noted that all n sub-cells will be placed simultaneously.

In a non-limiting example embodiment variation, after the first row of n solar sub-cells 102 is placed in position at the SW-conductors layup station 231, a narrow SW-conductor 212 is placed onto each of the solar sub-cell 102, such that the position designated for the next row of solar sub-cell 102 of the same column of solar sub-cells 102, in the next row of solar sub-cells 102, is covered be the remainder of the placed SW-conductor 212. Then, the second row of n solar sub-cells 102 is placed onto the remainder of the placed SW-conductor 212 the respective column of the solar sub-cell 102. Then, a second set of the narrow SW-conductors 212 is placed onto the respective solar sub-cells 102 of the second row of solar sub-cells 102, such that the respective position designated for the next (third) row of solar sub-cells 102 is covered be the remainder of second SW-conductor 212. This process continues until all m solar sub-cells 102 in each column are interconnected by the respective of m (or m−1) SW-conductors 212, facilitating the formation of n serially connected columns of solar sub-cells 102 into strings of solar sub-cells 102.

Figure 14C:
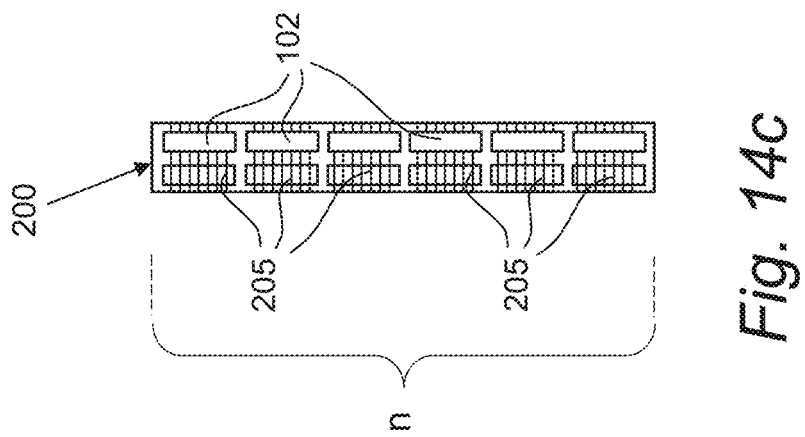
FIG. 14c illustrates an example single wide SW-conductors that is configured to mechanically and electrically connect two neighboring rows two adjacent solar sub-cells of two neighboring rows in series, in each of the n columns of solar sub-cells in order to produce n strings having m solar sub-cells, wherein these two adjacent solar sub-cells belong to the same column, according to some embodiments of the present invention.

FIG. 14c illustrates a non-limiting example of a single wide SW-conductors 200 that is configured to mechanically and electrically and simultaneously connect two adjacent solar sub-cells 102 of two neighboring rows in series, in each of the n columns of solar sub-cells 102 in order to produce n strings having m solar sub-cells 102, wherein these two adjacent solar sub-cells 102 belong to the same column. This process, upon conclusion thereof, facilitates the simultaneous formation of n strings of m serially connected solar sub-cells 102.

In a non-limiting example embodiment variation of the present disclosure that is related to utilizing wide SW-conductor 200, and that is configured to mechanically and electrically connect each pair of the neighboring cells of two adjacent rows of n sub-cells, where these rows are placed row after row and connected by the wide SW-conductor 200, as illustrated on FIG. 2a, 2b, 2c (Prior art). It should be noted that all n sub-cells will be placed simultaneously.

In a non-limiting example embodiment variation, after the first row of n solar sub-cells 102 is placed in position at the SW-conductors layup station 231, a wide SW-conductor 200 is placed onto that first row of solar sub-cells 102, such that the position designated for the next row of solar sub-cells 102 is covered be the remainder of the placed wide SW-conductor 200. Then, the second row of n solar sub-cells 102 is placed onto the remainder of wide SW-conductor 200. Then, a second wide SW-conductor 200 is placed onto that second row of solar sub-cells 102, such that the position designated for the next row of solar sub-cells 102 is covered be the remainder of second wide SW-conductor 200. This process continues until all m solar sub-cells 102 in each column are interconnected by the respective of m (or m−1) wide SW-conductor 200, facilitating the simultaneous formation of n strings of m serially connected strings of solar sub-cells 102.

Figure 15A:
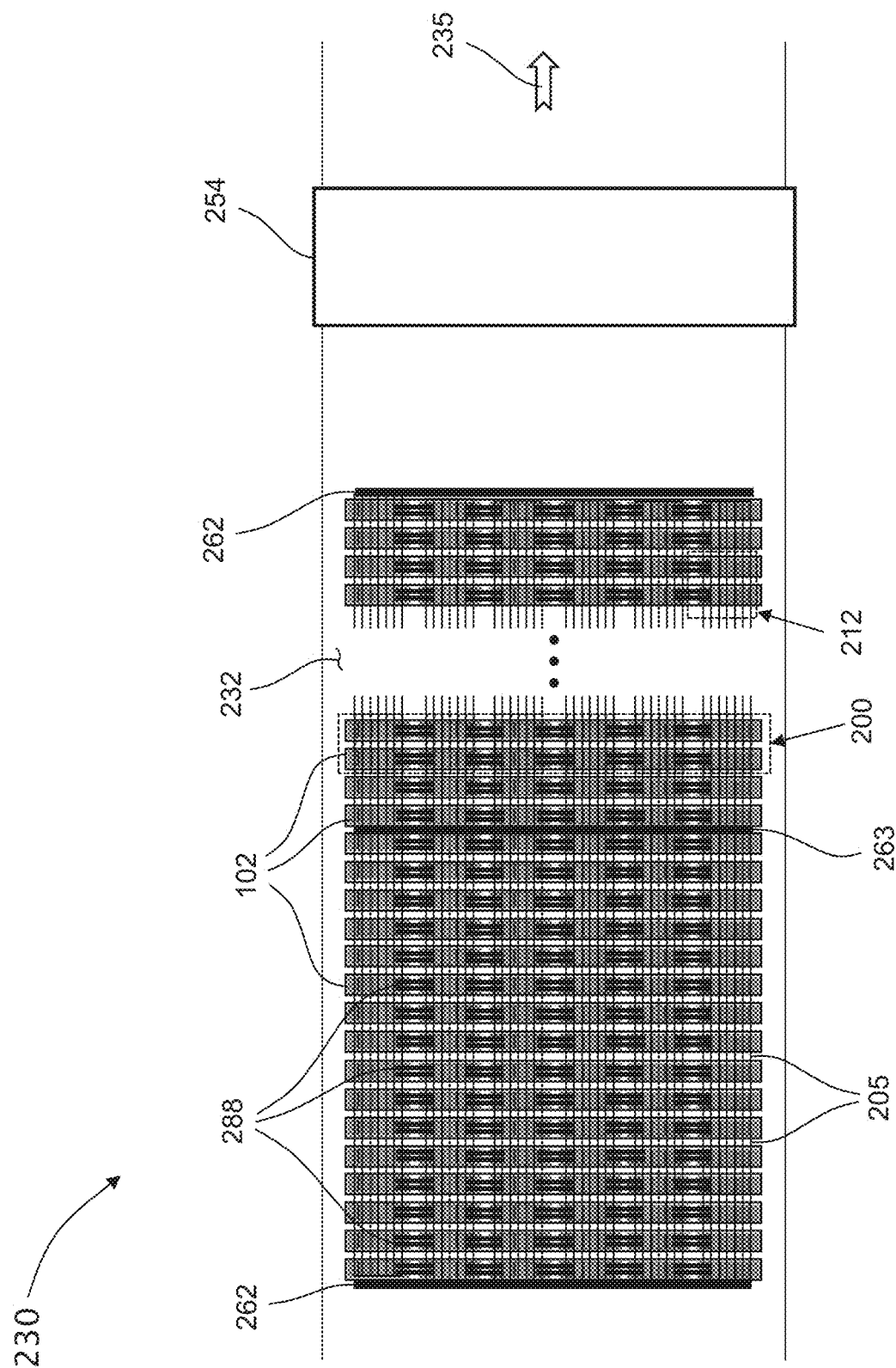
FIG. 15a illustrates an example segment of a SW-conductors layup conveyor belt, being part of a SWCT stringer machine, according to some embodiments of the present invention.

FIG. 15a illustrates an example segment of a SW-conductors layup conveyor belt 232, being part of a SWCT stringer machine 230. SW-conductors layup conveyor belt 232 is configured to receive and convey the array of solar sub-cells 102 coupled with either a respective set of narrow SW-conductors 212 or a single wide SW-conductor 200, in a direction 235, wherein the array of solar sub-cells 102 is predesigned to consist of m rows and n columns of solar sub-cells 102 (required for the production of a designated SSCP). The array of solar sub-cells 102 is placed onto the wide SW-conductors conveyer belt 232, wherein the solar sub-cells 102 are spaced apart by gaps as predesigned for the designated panel of the array of solar sub-cells 102, which array of solar sub-cells 102 needs to be electrically interconnected both serially and in parallelly. For illustrative purposes only, one example of a narrow SW-conductors 212 and one example of a single wide SW-conductor 200 are shown in FIG. 15a.

It should be noted that unlike the fabrication individual strings of regular solar cells 20 by a respective SW-conductors foil, where it is required to place an insulation sheet and a sheet for lamination on all n strings, when fabricating the SSCA of solar sub-cells 102, according to the present SWCT related variations, the placement of the insulation sheet is postponed to a later stage.

Figure 15B:
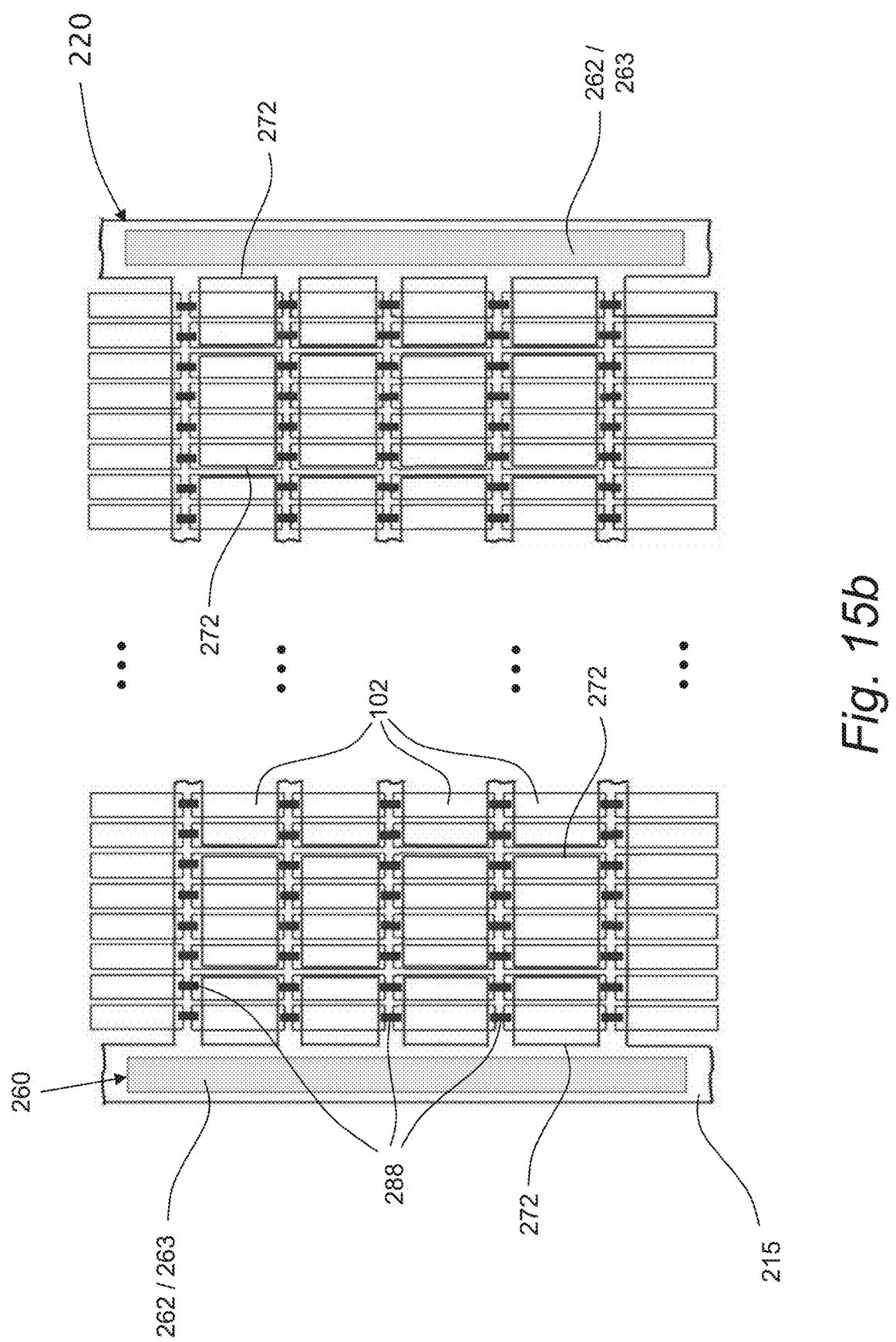
FIG. 15b illustrates an example single wide parallel connections polymer sheet that includes multiple short transverse conductors (jumpers), for parallel connection of individual solar sub-cells of the SSCA, according to some embodiments of the present invention.

FIG. 15b illustrates an example single wide parallel connections polymer sheet 220 that includes multiple short transverse conductors (jumpers) 288, for parallel connection of individual solar sub-cells 102 of the SSCA, and wide transverse conductors 260 for connecting the strings of solar sub-cells 102 of the SSCA in parallel (by wide transverse conductors 263) and for connecting the strings of solar sub-cells 102 of the SSCA to diodes (by wide transverse conductors 262) is placed over the SW-conductors foils, according to variation of the present disclosure.

Figure 15C:
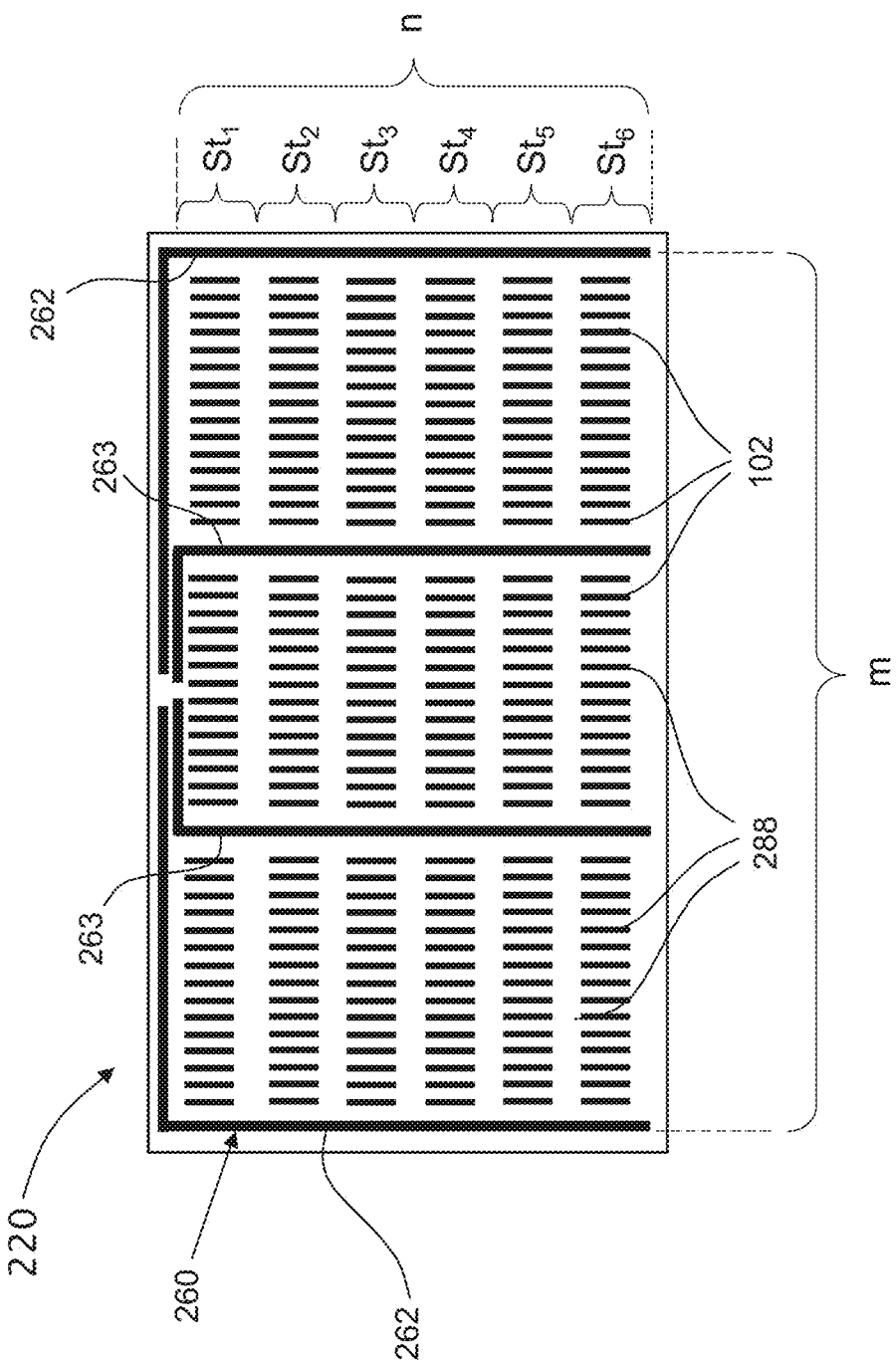
FIG. 15c illustrates an example arrangement of multiple strings of solar sub-cells of the SSCA, according to some embodiments of the present invention.

Wide parallel connections polymer sheet 220 includes short transverse SWCT jumpers 288 and wide transverse conductors 260, wherein upon soldering wide parallel connections polymer sheet 220 onto the SSCA of solar sub-cells 102, wherein the set of either SW-conductors 212 or wide SW-conductor 200 is in place, the SSCA of solar sub-cells 102 is mechanically and electrically interconnected both serially and in parallelly, ready for SSCP assembly. While short transverse SWCT jumpers 288 interconnect neighboring solar sub-cells 102 of the same row of solar sub-cells 102, in parallel, wide transverse conductors 262 connect in parallel the n strings ($St_1$, $St_2$, $St_3$, ..., $St_6$, shown for example in FIG. 15c), and wide transverse conductors 263 are used for diodes connection (see an example depicted in FIG. 11).

In another embodiment variation, reference is made back to FIG. 3 that illustrates an example flow of action in various stations of a portion of example production line 100. Before robotic catcher 129 places, row after row, m rows of solar sub-cells 102 on a wide array conveyor belt 232, another robotic catcher places on the SW-conductors layup station 231 of the wide conveyor belt 232 the wide SW-conductor parallel connections polymer (215) sheet 220 that includes short transverse SWCT jumpers 288 and wide transverse conductors 260 that facilitates the SSCA crisscross connection, from a back side of the solar sub-cells 102. As described hereabove, single wide SW-conductor parallel connections polymer sheet 220 is configured to provide all of the electrical parallel connection required for the SSCA of solar sub-cells 102, according to this variation of the present disclosure. After the placement of the wide SW-conductor parallel connections polymer sheet 220 onto wide conveyor belt 232, the production process continues with the placing either a respective set of SW-conductors 212 or a single wide SW-conductor 200 onto the n columns of solar sub-cells 102, to thereby facilitate the simultaneus formation of all n serially connected columns of solar sub-cells 102 into strings of solar sub-cells 102. All other processes including the building the SSCA is the same as in previous embodiment.

The wide parallel connections polymer sheet 220 is embedded in a polymer. To save in polymer cost and for better exposure light, wide parallel connections polymer sheet 220 a number of windows 272 (see for example FIG. 15b) are formed at non wired regions such as regions adjacent to the respective solar sub-cells 102.

It should be noted that unlike the fabrication of the individual strings of regular solar cells 20 by a respective SW-conductors foils, the combination of the set of wide SW-conductor polymer sheets 200 of the present disclosure interconnects and the wide parallel connections polymer sheet 220, interconnects mechanically and electrically all n strings both serially and parallelly, wherein no manual intervention is required in adjusting the placement of solar sub-cells 102 after being placed on a wide SW-conductors layup conveyor belt, such as wide array conveyor belt 232.

The n strings of solar sub-cells 120 with prepared SSCA SWCT network is ready to be overlaid by an insulation sheet and a sheet for lamination, wherein SSCA SWCT network is the conveyed through a SWCT soldering oven 254 for soldering of all conductors connections and lamination. All other processes of the required for manufacturing the designated SSCP, proceed the same as in the manufacturing process of a regular solar array panel.

While example materials for elements have been described, the present disclosure invention is not limited by these materials.

Various modifications can be made in the design and operation of the present disclosure invention without departing from its spirit. Thus, while examples of construction of the present disclosure invention have been explained in what is now considered to represent its example embodiments, it should be understood that within the scope of the patent, the present disclosure invention may be practiced otherwise than as specifically illustrated and described.

The features disclosed in the above description and in the drawings may be significant both individually and in any desired combination in order to realize the various embodiments of the present disclosure.

Although the present disclosure invention has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by this patent.

While certain embodiments of the inventions have been described, wherein these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

The present invention being thus described in terms of several embodiments and examples, it will be appreciated that the same may be varied in many ways. Such variations are not to be regarded as a departure from the spirit and scope of the invention, and all such modifications as would be obvious to one skilled in the art are contemplated.

What is claimed is:

1. A method for conveying a Solar Sub-cells Crisscross matrix Array (SSCA) of solar sub-cells on a production line, the method comprising the steps of:
    placing at least n times m of said solar sub-cells onto a narrow sub-cells receptor conveyer belt configured to carry a stream of said solar sub-cells, wherein each row of the SSCA includes n solar sub-cells, and each column of the array of solar sub-cells includes m solar sub-cells;
    transferring m rows of n of said solar sub-cells from said narrow sub-cells receptor conveyor belt to a wide array conveyor belt, one row of said solar sub-cells at a time, forming thereon said wide layup conveyer an array of said solar sub-cells, wherein said array of said solar sub-cells comprises n columns of said solar sub-cells, and wherein each of said columns comprises m of said solar sub-cells;
    placing n busbars or groups of Smart Wire (SW) conductors on each of said n columns of said solar sub-cells to thereby electrically connect said columns of said solar sub-cells in series;
    placing short parallel jumpers between all pairs of neighboring said solar sub-cells in each of said m rows of said solar sub-cells;
    placing wide transverse conductors for parallel connection of said n column and for diodes connection; and
    soldering said n×m matrix array of said solar sub-cells with said short parallel jumpers and said wide transverse conductors, to thereby form a soldered SSCA of n strings and m rows.

2. The method of claim 1, wherein a predesigned gap $g_2$ is formed between said solar sub-cells placed onto said narrow sub-cells receptor conveyor belt.

3. The method of claim 2, wherein the predesigned gap $g_2$ is formed between said solar sub-cells of each of said rows.

4. The method of claim 1, wherein a predesigned gap $g_1$ is formed between said solar sub-cells in each column of said solar sub-cells placed onto said wide array conveyor belt.

5. The method of claim 1, wherein said placement of said solar sub-cells onto said narrow sub-cells receptor conveyer belt is carried out by a single-sub-cell catcher.

6. The method of claim 1, wherein said transfer of m rows of n of said solar sub-cells from said narrow sub-cells receptor conveyor belt to said wide array conveyor belt, is carried out by a row-sub-cells catcher.

7. The method of claim 6, wherein electrical interconnection of said solar sub-cells is carried out utilizing conventional electric wiring-based technologies.

8. The method of claim 6, wherein electrical interconnection of said solar sub-cells is carried out utilizing Smart Wire Connection Technologies (SWCT) based wiring.

9. The method of claim 8, wherein said placement of said n busbars on each of said n columns of said solar sub-cells is carried out at a busbars-layup station, by using 1 to n busbars roles, available at said busbars-layup station.

10. The method of claim 9, wherein said placement of said short parallel jumpers is carried out by a jumpers-catcher.

11. The method of claim 8, wherein said electrical interconnection of said solar sub-cells in series is carried out by a wide SW-conductor that is placed over one row of said solar sub-cell and beneath the second row of said solar sub-cell of each pair of said m rows of SSCA.

12. The method of claim 11, wherein said placement of said n incorporated groups of SW-conductors on each of said n columns of said solar sub-cells is carried out at a SW-conductors layup station.

13. The method of claim 11, wherein said placement of said wide SW-conductors on respective pairs of said each pair of solar sub-cells in all columns of the SSCA, comprising the steps of:
    after the first row of said n solar sub-cells is placed in position at the SW-conductors layup station, placing a wide SW-conductor onto said first row of said solar sub-cell, such that the position designated for the second row of said solar sub-cell, is covered by the remainder of said placed wide SW-conductors;
    placing said second row of said solar sub-cell onto said remainder of said placed wide SW-conductors;
    placing a wide SW-conductors onto said second row of said solar sub-cells, such that the position designated for the next row of said solar sub-cells, is covered by the remainder of the recently placed wide SW-conductors; and
    continue repeating the step of placing the wide SW-conductors onto said second row of said solar sub-cells until all m solar sub-cells in each of said n columns are interconnected by the respective m (or m−1) of said SW-conductor.

14. The method of claim 8, wherein said electrical interconnection of said solar sub-cells in series is carried out by a wide SW-conductor that is placed over one row of said solar sub-cell and beneath the second row of said solar sub-cell of each pair of said m rows of SSCA, wherein said placement of said wide SW-conductors on respective pairs of said each pair of solar sub-cells in all columns of the SSCA, comprising the steps of:
    after the first row of said n solar sub-cells is placed in position at the SW-conductors layup station, placing a wide SW-conductor onto said of first row of said solar sub-cell, such that the position designated for the second row of said solar sub-cell, is covered by the remainder of said placed wide SW-conductors;
    placing said second row of said solar sub-cell onto said remainder of said placed wide SW-conductors;
    placing a wide SW-conductors onto said second row of said solar sub-cells, such that the position designated for a next row of said solar sub-cells, is covered by the remainder of the recently placed wide SW-conductors; and continue repeating the step of placing the wide SW-conductors onto said second row of said solar sub-cells until all m solar sub-cells in each of said n columns are interconnected by the respective m (or m−1) of said SW-conductor.

15. A system for conveying a Solar Sub-cells Crisscross matrix Array (SSCA) of solar sub-cells on a production line, the system comprising:

a narrow sub-cells receptor conveyer belt configured to receive a stream of said solar sub-cells;

a robotic row-catcher configured to transfer rows of n of said solar sub-cells from said narrow sub-cells receptor conveyor belt to a wide array conveyer belt, one row of said solar sub-cells at a time, wherein each row of the SSCA includes n solar sub-cells and each column of the array of solar sub-cells includes m solar sub-cells;

means for placing n busbars or groups of Smart Wire (SW) conductors on each of the n columns of said solar sub-cells to thereby electrically connect said columns of said solar sub-cells in series;

a robotic jumpers-catcher configured to place short parallel jumpers between all pairs of neighboring said solar sub-cells in each of said m rows of said solar sub-cells;

a transverse conductors catcher configured to place wide transverse conductors for parallel connection of said n column and for diodes connection; and a soldering oven configure to solder said n×m matrix array of said solar sub-cells with said short parallel jumpers and said wide transverse conductors, to thereby form a soldered SSCA of n strings and m rows.

16. The system of claim 15, wherein said solar sub-cells are obtained from sub divided regular solar cells.

17. The system of claim 15, wherein a predesigned gap $g_2$ is formed between said solar sub-cells placed onto said narrow sub-cells receptor conveyer belt.

18. The system of claim 17, wherein the predesigned gap $g_2$ is formed between said solar sub-cells of each of said rows.

19. The system of claim 15, wherein a predesigned gap $g_1$ is formed between said solar sub-cells in each column of said solar sub-cells placed onto said wide array conveyor belt.

20. The system of claim 15, wherein said placement of said solar sub-cells onto said narrow sub-cells receptor conveyer belt is carried out by a single-sub-cell catcher.

* * * * *